(12) United States Patent
Yabu et al.

(10) Patent No.: US 10,908,429 B2
(45) Date of Patent: Feb. 2, 2021

(54) EXTREME ULTRAVIOLET LIGHT GENERATION SYSTEM, LASER BEAM SIZE CONTROLLING METHOD, AND ELECTRONIC DEVICE MANUFACTURING METHOD

(71) Applicant: Gigaphoton Inc., Tochigi (JP)

(72) Inventors: Takayuki Yabu, Oyama (JP); Yuichi Nishimura, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/853,585

(22) Filed: Apr. 20, 2020

(65) Prior Publication Data

US 2020/0393687 A1 Dec. 17, 2020

(30) Foreign Application Priority Data

Jun. 13, 2019 (JP) ................ 2019-110286

(51) Int. Cl.
| | |
|---|---|
| G02B 27/09 | (2006.01) |
| G03F 7/20 | (2006.01) |
| H05G 2/00 | (2006.01) |
| H01S 3/00 | (2006.01) |
| H01S 3/223 | (2006.01) |

(52) U.S. Cl.
CPC ..... *G02B 27/0983* (2013.01); *G03F 7/70033* (2013.01); *H01S 3/0071* (2013.01); *H01S 3/2232* (2013.01); *H05G 2/008* (2013.01)

(58) Field of Classification Search
CPC ............ G01N 15/0205; G03F 7/70891; G03F 7/70033; G02B 27/0983; H01S 3/0071; H01S 3/2232

USPC ........................................ 250/504 R; 355/67
See application file for complete search history.

(56) References Cited

U.S. PATENT DOCUMENTS

| | | | |
|---|---|---|---|
| 7,679,743 B1 * | 3/2010 | Jung ................ | G01N 15/0205 356/335 |
| 9,516,729 B2 | 12/2016 | Zhang et al. | |
| 2011/0220816 A1 | 9/2011 | Kakizaki et al. | |
| 2013/0037693 A1 | 2/2013 | Moriya et al. | |

(Continued)

OTHER PUBLICATIONS

A Dutch Search Report issued by the Nederlands Patent Office dated Oct. 13, 2020, which corresponds to Dutch Patent Application No. 2025490 and is related to U.S. Appl. No. 16/853,585 with partial English translation.

*Primary Examiner* — Hung Nguyen
(74) *Attorney, Agent, or Firm* — Studebaker & Brackett PC

(57) ABSTRACT

An extreme ultraviolet light generation system according to one aspect of the present disclosure includes: a pulse laser apparatus configured to output a pulse laser beam, the pulse laser beam being supplied to a predetermined region in a chamber in which plasma containing extreme ultraviolet light is to be generated; a sensor configured to detect a beam size of the pulse laser beam; an actuator configured to change the beam size; and a controller. The controller performs, based on a first algorithm, first control that controls the actuator by a first control amount in a beam size minifying direction when the beam size has exceeded a first upper limit threshold in one burst duration, and then performs, based on a second algorithm, second control that controls the actuator by a second control amount smaller than the first control amount so that the beam size becomes closer to a target value.

20 Claims, 21 Drawing Sheets

(56) References Cited

U.S. PATENT DOCUMENTS

| | | |
|---|---|---|
| 2016/0285222 A1 | 9/2016 | Suganuma et al. |
| 2017/0250517 A1 | 8/2017 | Suzuki et al. |
| 2017/0280544 A1 | 9/2017 | Ueno et al. |
| 2019/0094717 A1* | 3/2019 | Yang ................... G03F 7/70033 |

* cited by examiner

EXTREME ULTRAVIOLET LIGHT GENERATION SYSTEM, LASER BEAM SIZE CONTROLLING METHOD, AND ELECTRONIC DEVICE MANUFACTURING METHOD

CROSS-REFERENCE TO RELATED APPLICATIONS

This application claims the benefit of Japanese Patent Application No. 2019-110286, filed on Jun. 13, 2019, the entire contents of which are hereby incorporated by reference.

BACKGROUND

1. Technical Field

The present disclosure relates to an extreme ultraviolet light generation system, a laser beam size controlling method, and an electronic device manufacturing method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation device configured to generate extreme ultraviolet (EUV) light at a wavelength of 13 nm approximately in combination with reduced projection reflective optics.

Disclosed EUV light generation devices include the three kinds of devices of a laser produced plasma (LPP) device that uses plasma generated by irradiating a target material with a pulse laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: US Published Patent Application No. 2011/0220816
Patent Document 2: US Published Patent Application No. 2013/0037693
Patent Document 3: US Published Patent Application No. 2017/0280544

SUMMARY

An extreme ultraviolet light generation system according to one aspect of the present disclosure includes: a pulse laser apparatus configured to output a pulse laser beam, the pulse laser beam being supplied to a predetermined region in a chamber in which plasma containing extreme ultraviolet light is to be generated; a sensor configured to detect a beam size of the pulse laser beam; an actuator configured to change the beam size; and a controller configured to control the actuator based on the beam size detected by the sensor. The controller performs, based on a first algorithm, first control that controls the actuator by a first control amount in a direction in which the beam size is minified when the beam size has exceeded a first upper limit threshold determined in advance in one burst duration, and after the first control, performs, based on a second algorithm different from the first algorithm, second control that controls the actuator by a second control amount smaller than the first control amount so that the beam size becomes closer to a target value.

A laser beam size controlling method according to another aspect of the present disclosure includes: outputting a pulse laser beam from a pulse laser apparatus; transmitting the pulse laser beam to a predetermined region in a chamber in which plasma containing extreme ultraviolet light is to be generated; detecting a beam size of the pulse laser beam by using the sensor; and controlling, by a controller, the actuator based on the beam size detected by using the sensor. The controller performs, based on a first algorithm, first control that controls the actuator by a first control amount in a direction in which the beam size is minified when the beam size has exceeded a first upper limit threshold determined in advance in one burst duration, and after the first control, performs, based on a second algorithm different from the first algorithm, second control that controls the actuator by a second control amount smaller than the first control amount so that the beam size becomes closer to a target value.

An electronic device manufacturing method according to another aspect of the present disclosure includes: irradiating a target substance with a pulse laser beam to generate plasma from the target substance and generate the extreme ultraviolet light, by using an extreme ultraviolet light generation system including a pulse laser apparatus configured to output the pulse laser beam, the pulse laser beam being supplied to a predetermined region in a chamber in which plasma containing extreme ultraviolet light is to be generated, a sensor configured to detect a beam size of the pulse laser beam, an actuator configured to change the beam size, and a controller configured to control the actuator based on the beam size detected by the sensor, the controller being configured to perform, based on a first algorithm, first control that controls the actuator by a first control amount in a direction in which the beam size is minified when the beam size has exceeded a first upper limit threshold determined in advance in one burst duration, and after the first control, perform, based on a second algorithm different from the first algorithm, second control that controls the actuator by a second control amount smaller than the first control amount so that the beam size becomes closer to a target value; outputting the extreme ultraviolet light to an exposure apparatus; and exposing a photosensitive substrate to the extreme ultraviolet light in the exposure apparatus to manufacture an electronic device.

BRIEF DESCRIPTION OF THE DRAWINGS

Embodiments of the present disclosure will be described below as examples with reference to the accompanying drawings.

DESCRIPTION OF EMBODIMENTS

Figure 1:
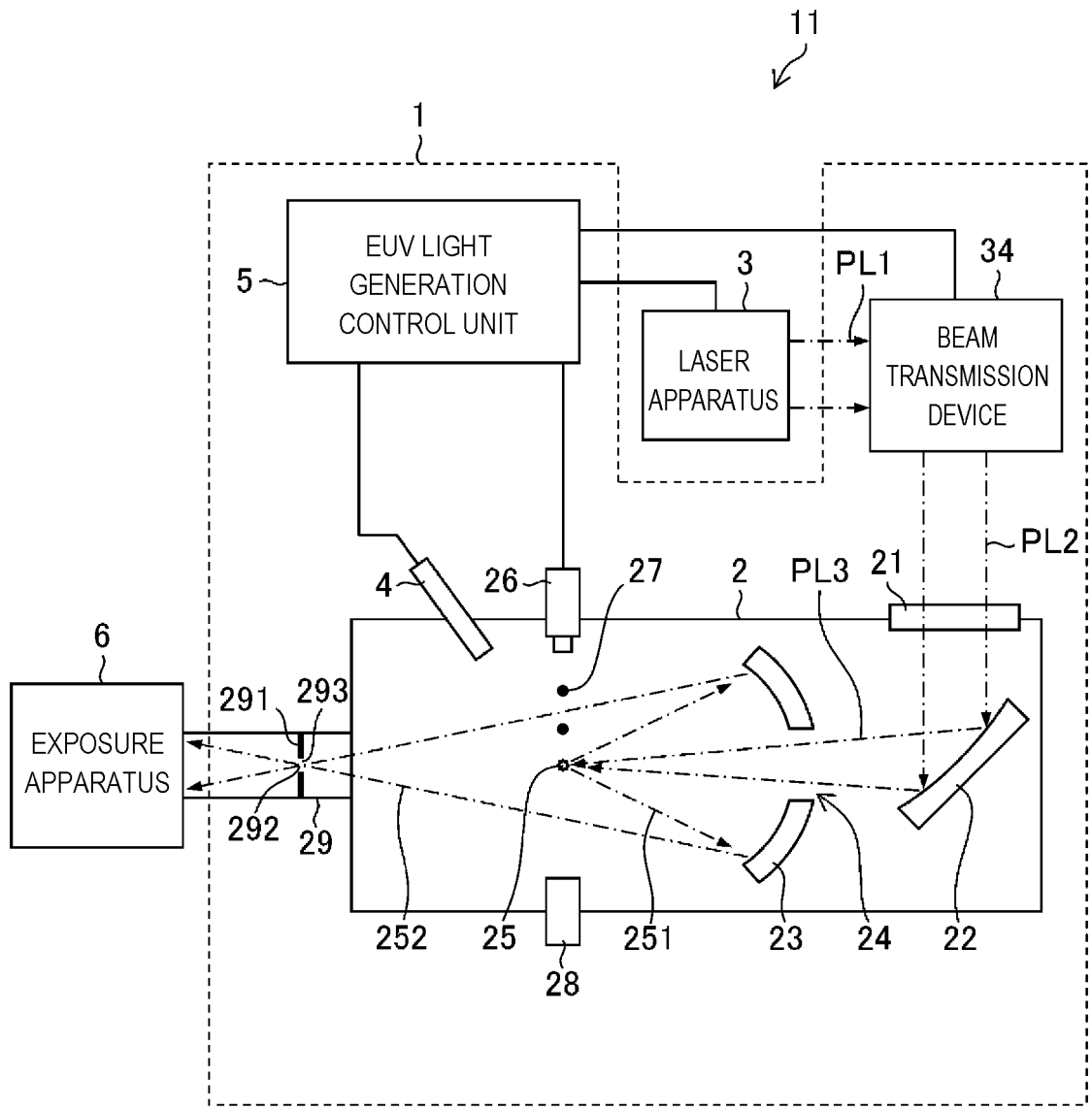
FIG. 1 schematically illustrates the configuration of an exemplary LPP EUV light generation system.

Contents
1. Terms
2. Overall description of EUV light generation system
   2.1 Configuration
   2.2 Operation
3. Description of burst operation
4. Exemplary configuration of EUV light generation system including beam transmission device
   4.1 Configuration
   4.2 Operation
5. Exemplary beam monitor
6. Exemplary beam expander
   6.1 Configuration
   6.2 Operation
7. Problem
8. Embodiment 1
   8.1 Configuration
   8.2 Operation
   8.3 Effect
   8.4 Modification 1 of control method determination
   8.5 Modification 2 of control method determination
9. Embodiment 2
   9.1 Configuration
   9.2 Operation
      9.2.1 Control method at large drift handling
      9.2.2 Control method at small drift handling
   9.3 Effect
10. Summary of control with beam size recovery characteristic in burst stop duration taken into account
    10.1 Exemplary control 1
       10.1.1 Modification
    10.2 Exemplary control 2
       10.2.1 Modification
11. Exemplary electronic device manufacturing method using EUV light generation system Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Terms

"Target" is an object irradiated with a laser beam introduced into the chamber. When irradiated with the laser beam, the target generates plasma and radiates EUV light. The target is the plasma generation source.

"Droplet" is a form of a target supplied into the chamber. The droplet may be a guttate target formed into a substantially spherical shape by the surface tension of a target substance being melted.

"Pulse laser beam" may be a laser beam including a plurality of pulses.

"Laser beam" is not limited to a pulse laser beam but may be a general laser beam.

"Laser beam path" is the optical path of a laser beam. "Upstream side" on the laser beam path is a side on the laser beam path closer to the light source of the laser beam. "Downstream side" is a side on the laser beam path closer to a plasma generation region.

"$CO_2$" is carbon dioxide.

"Plasma light" is radiation light radiated from the target as plasma. This radiation light includes EUV light.

"EUV light" stands for "extreme ultraviolet light". "Extreme ultraviolet light generation apparatus" is written as "EUV light generation apparatus".

"Optical element" is synonymous with an optical component or optical member.

2. Overall Description of EUV Light Generation System

2.1 Configuration

FIG. 1 schematically illustrates the configuration of an exemplary LPP EUV light generation system. This EUV light generation apparatus 1 is used together with at least one laser apparatus 3. Hereinafter, a system including the EUV light generation apparatus 1 and the laser apparatus 3 is referred to as an EUV light generation system 11.

The EUV light generation apparatus 1 includes a chamber 2 and a target supply unit 26. The chamber 2 is a sealable container. The target supply unit 26 supplies a target substance into the chamber 2 and is attached to, for example, penetrate through a wall of the chamber 2. The material of the target substance may contain tin, terbium, gadolinium, lithium, xenon, or a combination of two or more of these materials, but is not limited thereto.

The wall of the chamber 2 has at least one through-hole. The through-hole is blocked by a window 21 through which a pulse laser beam PL2 output from the laser apparatus 3 transmits. For example, an EUV condensation mirror 23 having a spheroidal reflective surface is disposed inside the chamber 2. The EUV condensation mirror 23 has a first focal point and a second focal point. For example, a multi-layer reflective film obtained by alternately stacking molybdenum and silicon is formed on the surface of the EUV condensation mirror 23. The EUV condensation mirror 23 is disposed so that, for example, the first focal point is positioned in a plasma generation region 25 and the second focal point is positioned at an intermediate focusing point (IF) 292. The EUV condensation mirror 23 is provided with a through-hole 24 at a central part thereof through which a pulse laser beam PL3 passes.

The EUV light generation apparatus 1 includes a target sensor 4 and an EUV light generation control unit 5. The target sensor 4 detects one or a plurality of the existence, trajectory, position, and speed of a target 27. The target sensor 4 may have an image capturing function.

In addition, the EUV light generation apparatus 1 includes a connection unit 29 that provides communication between the inside of the chamber 2 and the inside of an exposure apparatus 6. The connection unit 29 includes a wall 291 through which an aperture 293 is formed. The wall 291 is disposed so that the aperture 293 is positioned at the second focal point of the EUV condensation mirror 23.

In addition, the EUV light generation apparatus 1 includes a beam transmission device 34, a laser beam condensation mirror 22, and a target collection unit 28 configured to collect the target 27. The beam transmission device 34 includes an optical element for defining the transmission state of a laser beam, and an actuator for adjusting the position, posture, and the like of the optical element. The target collection unit 28 is disposed on an extended line in a direction in which the target 27 output into the chamber 2 travels.

2.2 Operation

The following describes operation of the exemplary LPP EUV light generation system 11 with reference to FIG. 1. The inside of the chamber 2 is held at pressure lower than atmospheric pressure, and may be preferably vacuum. Alternatively, gas having a high transmittance for EUV light exists inside the chamber 2. The gas existing inside the chamber 2 may be, for example, hydrogen gas.

A pulse laser beam PL1 output from the laser apparatus 3 passes through the beam transmission device 34, transmits through the window 21 as the pulse laser beam PL2, and is incident in the chamber 2. The pulse laser beam PL2 travels in the chamber 2 along at least one laser beam path and is reflected by the laser beam condensation mirror 22 and incident on at least one target 27 as the pulse laser beam PL3.

The target supply unit 26 outputs the target 27 formed of the target substance toward the plasma generation region 25 inside the chamber 2. The target supply unit 26 forms a droplet by, for example, a continuous jet scheme. In the continuous jet scheme, a nozzle is vibrated to provide periodic vibration to flow of the target substance ejected in a jet form from a nozzle hole, thereby periodically separating the target substance. The separated target substance forms a free interface by the own surface tension, thereby forming a droplet.

The target 27 is irradiated with at least one pulse included in the pulse laser beam PL3. Plasma is generated when the target 27 is irradiated with the pulse laser beam PL3, and radiates radiation light 251. EUV light 252 contained in the radiation light 251 is selectively reflected by the EUV condensation mirror 23. The EUV light 252 reflected by the EUV condensation mirror 23 is condensed at the intermediate focusing point 292 and output to the exposure apparatus 6. One target 27 may be irradiated with a plurality of pulses included in the pulse laser beam PL3.

The EUV light generation control unit 5 collectively controls the entire EUV light generation system 11. The EUV light generation control unit 5 processes a result of detection by the target sensor 4. The EUV light generation control unit 5 controls the output timing of the target 27, the output direction of the target 27, and the like based on the result of detection by the target sensor 4. In addition, the EUV light generation control unit 5 controls the oscillation timing of the laser apparatus 3, the traveling direction of the pulse laser beam PL2, the focusing position of the pulse laser beam PL3, and the like. The above-described various kinds of control are merely exemplary, and other control is added as necessary.

3. Description of Burst Operation

Figure 2:
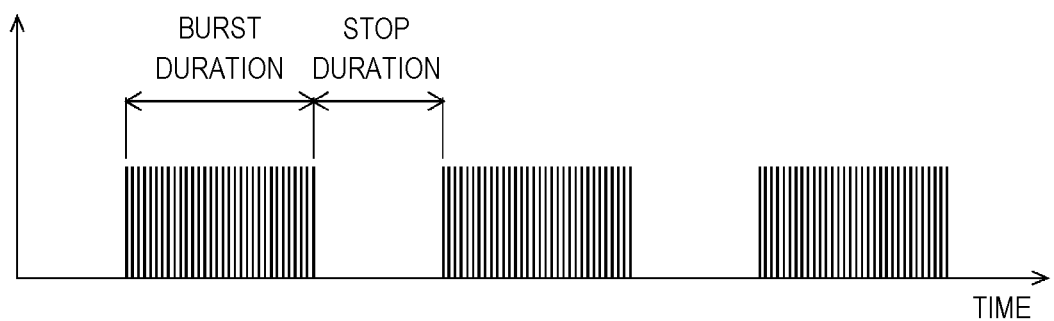
FIG. 2 illustrates exemplary burst operation.

FIG. 2 illustrates an exemplary burst operation. The horizontal axis represents time, and the vertical axis represents EUV energy. The EUV light generation system 11 may output EUV light through the burst operation. The burst operation repeats a burst duration in which EUV light is output at a predetermined repetition frequency for a certain duration, and a stop duration in which no EUV light is output for a predetermined duration.

In the burst duration, the pulse laser beam PL1 is output from the laser apparatus 3. In the stop duration, outputting of the pulse laser beam PL1 is stopped or propagation of the pulse laser beam PL3 to the plasma generation region 25 is prevented.

A burst pattern is defined by data including one or a plurality of the EUV energy, the repetition frequency, and the number of pulses of the burst duration, the length of the burst stop duration, and the number of bursts. The burst pattern is instructed by the exposure apparatus 6. The exposure apparatus 6 transmits a gate signal instructing the burst operation to the EUV light generation control unit 5.

4. Exemplary Configuration of EUV Light Generation System Including Beam Transmission Device

4.1 Configuration

Figure 3:
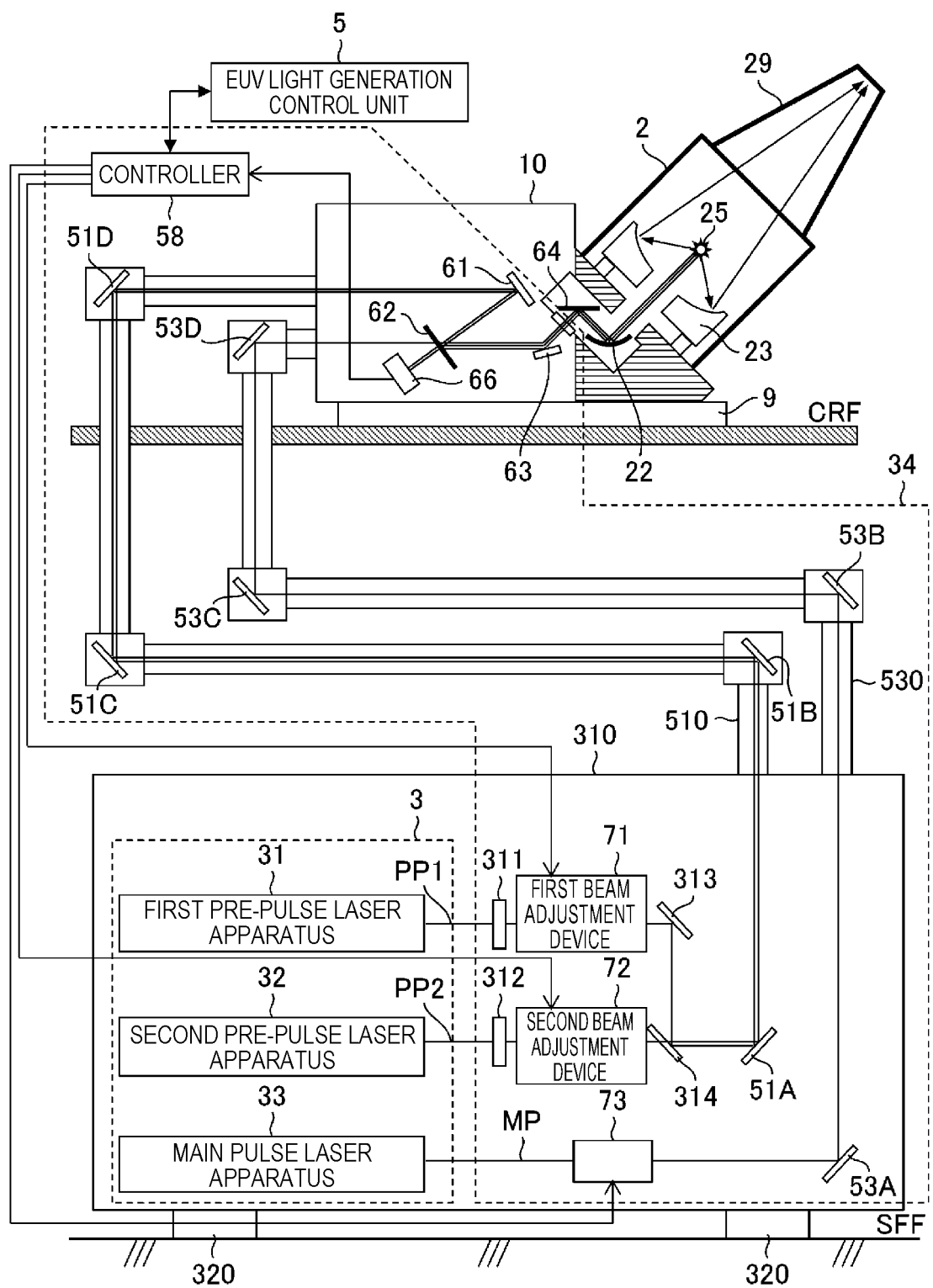
FIG. 3 is a partially cross-sectional view illustrating an exemplary EUV light generation system.

FIG. 3 illustrates a partial cross-sectional view of the EUV light generation system 11. The chamber 2 is disposed on a clean room floor CRF, and the laser apparatus 3 is disposed on a sub fabrication floor SFF. The sub fabrication floor SFF is positioned downstairs of the clean room floor CRF.

The laser apparatus 3 includes a first pre-pulse laser apparatus 31, a second pre-pulse laser apparatus 32, and a main pulse laser apparatus 33. The first pre-pulse laser apparatus 31 outputs a first pre-pulse laser beam PP1 having a pulse width in the order of picoseconds. The first pre-pulse laser apparatus 31 may be, for example, a Nd:YVO4 laser apparatus.

The second pre-pulse laser apparatus 32 outputs a second pre-pulse laser beam PP2 having a pulse width in the order of nanoseconds. The second pre-pulse laser apparatus 32 may be, for example, a Nd:YAG laser apparatus. The second pre-pulse laser beam PP2 may have a wavelength equal to that of the first pre-pulse laser beam PP1.

The pulse width in the order of picoseconds may be equal to or larger than 100 fs and smaller than 1 ns. The upper limit of the pulse width may be a pulse width with which the target 27 being dispersed undergoes low density dispersion in a hemispherical dome shape. A laser apparatus having a pulse width of 100 fs to 50 ps may include a mode lock laser as an oscillator. A laser apparatus having a pulse width equal to or larger than 50 ps may include a semiconductor laser as an oscillator.

A laser apparatus configured to output a pre-pulse laser beam having a pulse width in the order of femtoseconds may be used in place of a laser apparatus configured to output a pre-pulse laser beam having a pulse width in the order of picoseconds. The pulse width in the order of femtoseconds may be equal to or larger than 1 fs and smaller than 100 fs. A regeneration amplification mode lock laser may be used as a laser apparatus in the order of femtoseconds. For example, a laser apparatus using a Kerr lens mode-lock scheme may be used.

The pulse width in the order of nanoseconds may be equal to or larger than 1 ns. The upper limit of the pulse width in the order of nanoseconds may be determined to be a light intensity with which dispersion of the target 27 is insufficient or a light intensity with which part of the target 27 is not ionized. In addition, the upper limit may be determined by temporal restriction due to expansion and diffusion of the target 27.

A laser apparatus having a pulse width of several ns to several tens ns may have a configuration using Q switch oscillation. A laser apparatus having the larger pulse width may have a master oscillator power amplifier (MOPA) configuration. For example, a laser apparatus may use a semiconductor laser, a CW laser, or the like as an oscillator, and may temporally cut out a laser beam by an optical switch on the optical path to achieve a desired pulse width.

The main pulse laser apparatus 33 outputs a main pulse laser beam MP. The main pulse laser beam MP may have a wavelength different from wavelengths of the first pre-pulse laser beam PP1 and the second pre-pulse laser beam PP2. The main pulse laser apparatus 33 may be, for example, a $CO_2$ laser apparatus, and the main pulse laser beam MP may be a $CO_2$ laser beam.

The laser apparatus 3 may be fixed inside a housing 310 by a fixation device (not illustrated). The housing 310 is disposed on the sub fabrication floor SFF through an air suspension 320. The air suspension 320 may be replaced with another vibration reduction device.

The beam transmission device 34 is disposed across the clean room floor CRF and the sub fabrication floor SFF to connect the chamber 2 and the laser apparatus 3.

The beam transmission device 34 includes a $\lambda/2$ wave plate 311, a $\lambda/2$ wave plate 312, a first beam adjustment device 71, a second beam adjustment device 72, a high reflectance mirror 313, a polarization beam splitter 314, high reflectance mirrors 51A to 51D, a beam expander 73, high reflectance mirrors 53A to 53D, a high reflectance mirror 61, a beam combiner 62, a beam monitor 66, a high reflectance mirror 63, and a controller 58.

The $\lambda/2$ wave plate 311 is disposed on the optical path of the first pre-pulse laser beam PP1 output from the first pre-pulse laser apparatus 31. The $\lambda/2$ wave plate 312 is disposed on the optical path of the second pre-pulse laser beam PP2 output from the second pre-pulse laser apparatus 32.

The $\lambda/2$ wave plate 311 and the $\lambda/2$ wave plate 312 are configured so that the polarization states of the first pre-pulse laser beam PP1 and the second pre-pulse laser beam PP2 become different from each other. For example, the $\lambda/2$ wave plate 311 and the $\lambda/2$ wave plate 312 are configured so that the first pre-pulse laser beam PP1 is incident in S polarization and the second pre-pulse laser beam PP2 is incident in P polarization on the entrance surface of the polarization beam splitter 314.

The first beam adjustment device 71 is disposed on the optical path of the first pre-pulse laser beam PP1 output from the first pre-pulse laser apparatus 31. The first beam adjustment device 71 adjusts beam parameters of the first pre-pulse laser beam PP1.

The second beam adjustment device 72 is disposed on the optical path of the second pre-pulse laser beam PP2 output from the second pre-pulse laser apparatus 32. The second beam adjustment device 72 adjusts beam parameters of the second pre-pulse laser beam PP2.

The first beam adjustment device 71 and the second beam adjustment device 72 may each include a plurality of mirrors, a plurality of lenses, or a combination of at least one mirror and at least one lens, and may be each a beam expander.

The beam parameters adjusted by each of the first beam adjustment device 71 and the second beam adjustment device 72 include, for example, at least some of the beam position, the beam shape, the beam cross-sectional area, the beam size, the beam divergence, the wavefront, and the beam traveling direction. The beam size conceptually includes the beam width and the beam diameter.

The high reflectance mirror 313 reflects, toward the polarization beam splitter 314, the first pre-pulse laser beam PP1 emitted from the first beam adjustment device 71.

The polarization beam splitter 314 is disposed so that the optical path of the first pre-pulse laser beam PP1 emitted from the first beam adjustment device 71 and the optical path of the second pre-pulse laser beam PP2 emitted from the second beam adjustment device 72 are substantially aligned with each other. For example, the polarization beam splitter 314 transmits light incident in P polarization and reflects light incident in S polarization.

The high reflectance mirror 51A is disposed on the optical paths of the first pre-pulse laser beam PP1 and the second pre-pulse laser beam PP2 emitted from the polarization beam splitter 314. The high reflectance mirror 51A reflects the first pre-pulse laser beam PP1 and the second pre-pulse laser beam PP2 toward an optical path pipe 510.

The high reflectance mirror 53A is disposed on the optical path of the main pulse laser beam MP output from the main pulse laser apparatus 33. The high reflectance mirror 53A reflects the main pulse laser beam MP toward an optical path pipe 530.

The beam transmission device 34 guides, to the clean room floor CRF, the first pre-pulse laser beam PP1 and the second pre-pulse laser beam PP2 reflected by the high reflectance mirror 51A on the sub fabrication floor SFF. The beam transmission device 34 guides, to the clean room floor CRF, the main pulse laser beam MP reflected by the high reflectance mirror 53A on the sub fabrication floor SFF.

In a region across the sub fabrication floor SFF and the clean room floor CRF, the beam transmission device 34 includes an optical element group including a plurality of high reflectance mirrors 51B to 51D and 53B to 53D, and the optical path pipes 510 and 530 each covering the transmission path of a pulse laser beam. The hollow insides of the optical path pipes 510 and 530 may be vacuum, or for example, dry air or inert gas may be introduced into the optical path pipes 510 and 530. When, for example, dry air or inert gas is introduced into the optical path pipes 510 and 530, these gaseous matters may have low pressure close to vacuum.

The high reflectance mirrors 51B to 51D are disposed in the optical path pipe 510. The high reflectance mirrors 51A to 51D form a transmission path through which the first pre-pulse laser beam PP1 and the second pre-pulse laser beam PP2 output from the laser apparatus 3 are guided from the sub fabrication floor SFF to the clean room floor CRF. The high reflectance mirrors 51B to 51D each reflect the first pre-pulse laser beam PP1 and the second pre-pulse laser beam PP2. The optical path pipe 510 covers the transmission path of the first pre-pulse laser beam PP1 and the second pre-pulse laser beam PP2 multiplexed by the polarization beam splitter 314.

The high reflectance mirrors 53B to 53D are disposed in the optical path pipe 530. The high reflectance mirrors 53A to 53D form a transmission path through which the main pulse laser beam MP output from the laser apparatus 3 is guided from the sub fabrication floor SFF to the clean room floor CRF. The high reflectance mirrors 53B to 53D each reflect the main pulse laser beam MP. The optical path pipe 530 covers the transmission path of the main pulse laser beam MP.

On the clean room floor CRF, the chamber 2 is fixed on a chamber reference member 10. The chamber reference member 10 is fixed on the clean room floor CRF through an installation mechanism 9. The chamber reference member 10 houses the optical element group as part of the beam transmission device 34. For example, the high reflectance mirror 61, the beam combiner 62, the beam monitor 66, and the high reflectance mirror 63 are disposed in the chamber reference member 10.

The high reflectance mirror 61 reflects, toward the beam monitor 66, the first pre-pulse laser beam PP1 and the second pre-pulse laser beam PP2 reflected by the high reflectance mirror 51D.

The beam combiner 62 is disposed so that the optical paths of the first pre-pulse laser beam PP1 and the second pre-pulse laser beam PP2 emitted from the polarization beam splitter 314 and the optical path of the main pulse laser beam MP output from the main pulse laser apparatus 33 are substantially aligned with each other. For example, the beam combiner 62 may be a dichroic mirror configured to highly reflect light having a wavelength equal to wavelengths of the first pre-pulse laser beam PP1 and the second pre-pulse laser beam PP2 and configured to highly transmit light having a wavelength equal to that of the main pulse laser beam MP.

The beam combiner 62 reflects, toward the high reflectance mirror 63 at high reflectance, the first pre-pulse laser beam PP1 and the second pre-pulse laser beam PP2 reflected by the high reflectance mirror 61, and transmits, to the beam monitor 66 as sample light, part of the first pre-pulse laser beam PP1 and the second pre-pulse laser beam PP2 reflected by the high reflectance mirror 61. In addition, the beam combiner 62 transmits, toward the high reflectance mirror 63 at high transmittance, the main pulse laser beam MP reflected by the high reflectance mirror 53D, and reflects, toward the beam monitor 66 as sample light, part of the main pulse laser beam MP reflected by the high reflectance mirror 53D.

The beam monitor 66 measures the beam parameters of the first pre-pulse laser beam PP1 and the second pre-pulse laser beam PP2 having transmitted through the beam combiner 62, and the beam parameters of the main pulse laser beam MP reflected by the beam combiner 62. The beam monitor 66 includes a light receiving surface on which sample light is incident. The beam monitor 66 outputs, to the controller 58, a detected value for calculating parameters related to the beam size and wavefront of the sample light on the light receiving surface. The parameter related to the wavefront may be, for example, the beam divergence.

The controller 58 is connected with the beam monitor 66, the first beam adjustment device 71, the second beam adjustment device 72, the beam expander 73, and the EUV light generation control unit 5. The controller 58 calculates a beam parameter value related to the beam size of the sample light based on the detected value output from the beam monitor 66.

The controller 58 may perform feedback control of the first beam adjustment device 71, the second beam adjustment device 72, and the beam expander 73 by using the calculated beam parameter value so that the sample light having a beam size and a wavefront in predetermined ranges is incident on the light receiving surface of the beam monitor 66.

The high reflectance mirror 63 reflects, toward a planar mirror 64, the first pre-pulse laser beam PP1, the second pre-pulse laser beam PP2, and the main pulse laser beam MP emitted from the beam combiner 62. The first pre-pulse laser beam PP1, the second pre-pulse laser beam PP2, and the main pulse laser beam MP are reflected by the planar mirror 64 and the laser beam condensation mirror 22 at high reflectance and condensed to the plasma generation region 25.

In the present disclosure, a control device such as the EUV light generation control unit 5, the controller 58, or a control unit of the exposure apparatus 6 may be achieved by hardware and software combination of one or a plurality of computers. The software is synonymous with a computer program. The computers conceptually include a programmable controller.

Functions of a plurality of control devices can be achieved by a single control device. In addition, in the present disclosure, for example, the EUV light generation control unit 5, the controller 58, and the control unit of the exposure apparatus 6 may be connected with each other through communication networks such as a local area network and the Internet. In a distributed computing environment, a computer program unit may be stored in local and remote memory storage devices.

4.2 Operation

The laser apparatus 3 outputs the first pre-pulse laser beam PP1, the second pre-pulse laser beam PP2, and the main pulse laser beam MP in the stated order. The optical path of the first pre-pulse laser beam PP1 reaches the polarization beam splitter 314 through the λ/2 wave plate 311 and the first beam adjustment device 71. The optical path of the second pre-pulse laser beam PP2 reaches the polarization beam splitter 314 through the λ/2 wave plate 312 and the second beam adjustment device 72. The optical path of the first pre-pulse laser beam PP1 and the optical path of the second pre-pulse laser beam PP2 are substantially aligned with each other at the polarization beam splitter 314.

The first pre-pulse laser beam PP1 and the second pre-pulse laser beam PP2 emitted from the polarization beam splitter 314 are guided to the beam combiner 62 through the high reflectance mirrors 51A to 51D and 61. Part of the first pre-pulse laser beam PP1 and the second pre-pulse laser beam PP2 guided to the beam combiner 62 transmits through the beam combiner 62 and is incident on the beam monitor 66. The first pre-pulse laser beam PP1 and the second pre-pulse laser beam PP2 reflected by the beam combiner 62 are introduced into the chamber 2.

The main pulse laser beam MP output from the laser apparatus 3 is guided to the beam combiner 62 through the beam expander 73 and the high reflectance mirrors 53A to 53D. Part of the main pulse laser beam MP guided to the beam combiner 62 is reflected by the beam combiner 62 and incident on the beam monitor 66. The main pulse laser beam MP having transmitted through the beam combiner 62 is introduced into the chamber 2.

The beam monitor 66 measures the beam parameters of the first pre-pulse laser beam PP1, the second pre-pulse laser beam PP2, and the main pulse laser beam MP. Measured values detected by the beam monitor 66 are input to the controller 58, and the controller 58 controls the first beam adjustment device 71, the second beam adjustment device 72, and the beam expander 73 so that the measured beam parameter of each pulse laser beam has a desired value.

The target 27 is dispersed when irradiated with the first pre-pulse laser beam PP1 guided into the chamber 2. When irradiated with the second pre-pulse laser beam PP2, the dispersed target 27 becomes a diffused target being diffused at a smaller particle size. Thereafter, plasma is generated when the diffused target is irradiated with the main pulse laser beam MP, and EUV light is radiated from the plasma.

5. Exemplary Beam Monitor

Figure 4:
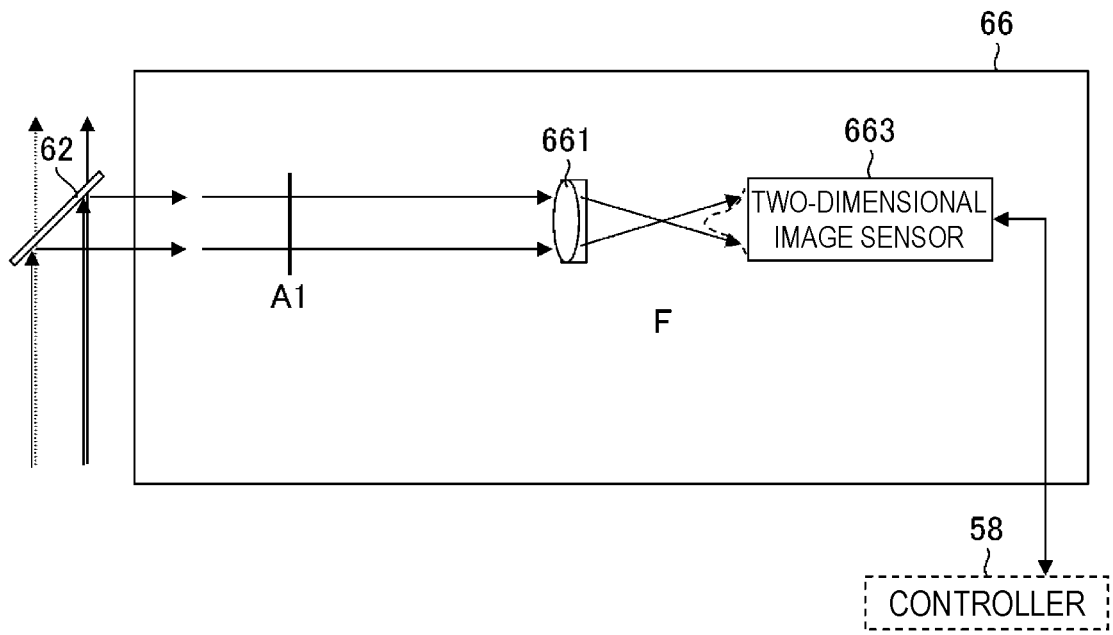
FIG. 4 illustrates an exemplary configuration of a beam monitor.

FIG. 4 illustrates an exemplary configuration of the beam monitor 66. The following describes an example in which the beam size is measured. The beam monitor 66 includes a transfer optical system 661 and a two-dimensional image sensor 663. The transfer optical system 661 transfers, onto a light receiving surface of the two-dimensional image sensor 663, a beam profile at an optional position A1 between the beam combiner 62 and the transfer optical system 661 on the optical path of the sample light. The transfer optical system 661 preferably includes an achromatic lens having chromatic aberration corrected. The two-dimensional image sensor 663 outputs measurement data of the beam profile transferred onto the light receiving surface to the controller 58.

The controller 58 calculates a beam size D of the sample light at the position A1 based on the output data from the two-dimensional image sensor 663. The beam size in the beam profile may be, for example, the width of a part having an intensity equal to or higher than $1/e^2$ of a peak intensity in light intensity distribution. The symbol e is Napier's constant.

6. Exemplary Beam Expander

6.1 Configuration

Figure 5:
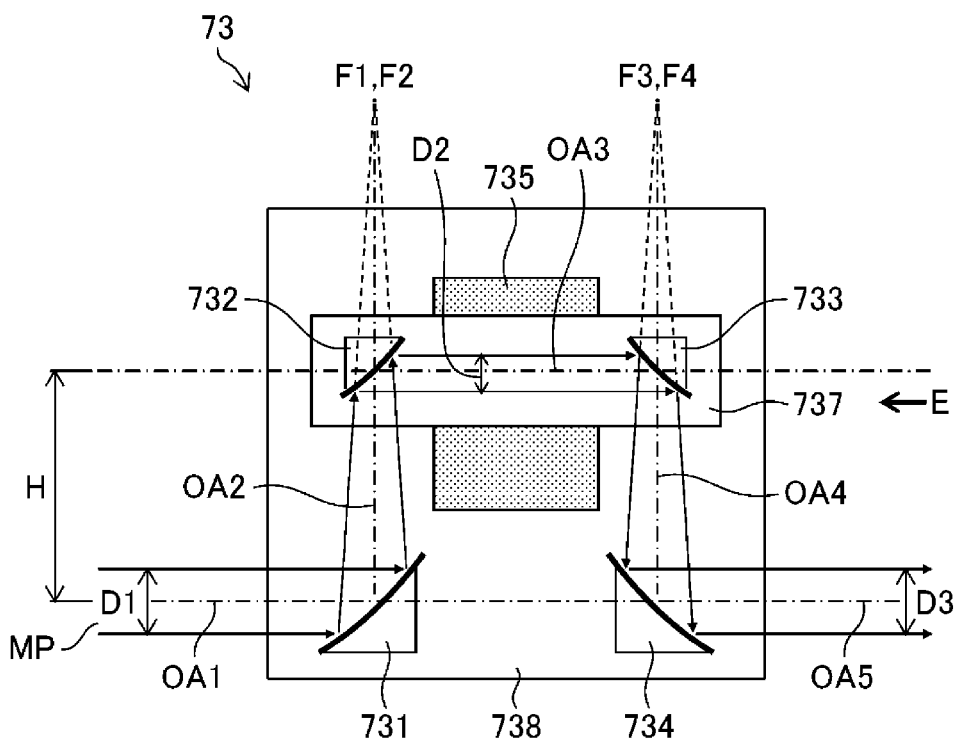
FIG. 5 illustrates an exemplary configuration of a beam expander.
Figure 6:
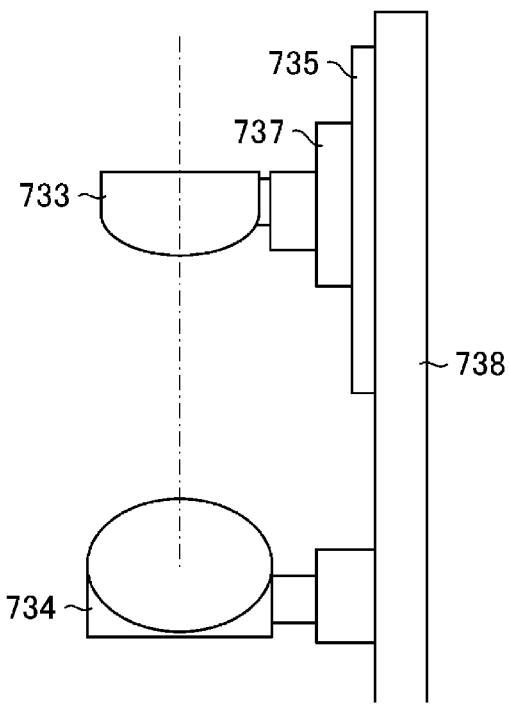
FIG. 6 is an Arrow E diagram when viewed in the direction of Arrow E in FIG. 5.

FIG. 5 illustrates an exemplary configuration of the beam expander 73. FIG. 6 is an Arrow E diagram when viewed in the direction of Arrow E in FIG. 5. The beam expander 73 includes two off-axis parabolic concave mirrors 731 and 734 and two off-axis parabolic convex mirrors 732 and 733. The off-axis parabolic concave mirror 731, the off-axis parabolic convex mirror 732, the off-axis parabolic convex mirror 733, and the off-axis parabolic concave mirror 734 are disposed in the stated order on the optical path of the main pulse laser beam MP.

The off-axis parabolic concave mirror 731 and the off-axis parabolic convex mirror 732 form an upstream pair, and the off-axis parabolic convex mirror 733 and the off-axis parabolic concave mirror 734 form a downstream pair. The disposition order of off-axis parabolic concave and convex mirrors may be opposite between the upstream pair and the downstream pair.

In the state illustrated in FIG. 5, the beam expander 73 is configured so that a focal point F1 of the off-axis parabolic concave mirror 731 and a focal point F2 of the off-axis parabolic convex mirror 732 coincide with each other, and a focal point F3 of the off-axis parabolic convex mirror 733 and a focal point F4 of the off-axis parabolic concave mirror 734 coincide with each other.

In disposition in which the focal points of each of the upstream pair and the downstream pair coincide with each other, a pulse laser beam emitted from the beam expander 73 is parallel light when a pulse laser beam incident on the beam expander 73 is parallel light.

The off-axis parabolic concave mirrors 731 and 734 each have a reflective surface having a curved surface shape expressed by the same function. The off-axis parabolic convex mirrors 732 and 733 each have a reflective surface having a curved surface shape expressed by the same function.

The off-axis parabolic concave mirrors 731 and 734 and the off-axis parabolic convex mirrors 732 and 733 are disposed so that an optical axis OA2 between the off-axis parabolic concave mirror 731 and the off-axis parabolic convex mirror 732 and an optical axis OA4 between the off-axis parabolic convex mirror 733 and the off-axis parabolic concave mirror 734 are parallel to each other.

The off-axis parabolic concave mirrors 731 and 734 and the off-axis parabolic convex mirrors 732 and 733 are disposed so that an optical axis OA1 of the main pulse laser beam MP incident on the off-axis parabolic concave mirror 731 and an optical axis OA5 of the main pulse laser beam MP emitted from the off-axis parabolic concave mirror 734 are aligned with each other.

The off-axis parabolic concave mirrors 731 and 734 and the off-axis parabolic convex mirrors 732 and 733 are disposed so that the optical axis OA1 of the main pulse laser beam MP incident on the off-axis parabolic concave mirror 731, an optical axis OA3 between the off-axis parabolic convex mirror 732 and the off-axis parabolic convex mirror 733, and the optical axis OA5 of the main pulse laser beam MP emitted from the off-axis parabolic concave mirror 734 are parallel to each other.

The angle between the optical axis OA1 of the main pulse laser beam MP incident on the off-axis parabolic concave mirror 731 and the optical axis OA2 between the off-axis parabolic concave mirror 731 and the off-axis parabolic convex mirror 732 may be right angle.

The distance between the off-axis parabolic convex mirror 732 and the off-axis parabolic concave mirror 731 and the distance between the off-axis parabolic convex mirror 733 and the off-axis parabolic concave mirror 734 are equal to each other and denoted by H. The distance H between the off-axis parabolic convex mirror 732 and the off-axis parabolic concave mirror 731 may be the distance between a point at which the reflective surface of the off-axis parabolic concave mirror 731 intersects the optical axis OA2 and a point at which the reflective surface of the off-axis parabolic convex mirror 732 intersects the optical axis OA2. The distance H between the off-axis parabolic convex mirror 733 and the off-axis parabolic concave mirror 734 may be the distance between a point at which the reflective surface of the off-axis parabolic convex mirror 733 intersects the optical axis OA4 and a point at which the reflective surface of the off-axis parabolic concave mirror 734 intersects the optical axis OA4.

The beam expander 73 also includes a base plate 738 and a one-axis movement stage 735. The one-axis movement stage 735 is an electric stage including an actuator (not illustrated) and connected with the controller 58. The one-axis movement stage 735 includes a movement plate 737 that is movable on the one-axis movement stage 735 in one axial direction. The one-axis movement stage 735 is a movement device configured to move mirrors (the off-axis parabolic convex mirrors 732 and 733) fixed on the movement plate 737.

The one-axis movement stage 735 is disposed on the base plate 738 and can move the movement plate 737 relative to the base plate 738. The moving direction of the movement plate 737 is parallel to the optical axis OA2 between the off-axis parabolic concave mirror 731 and the off-axis parabolic convex mirror 732 and the optical axis OA4 between the off-axis parabolic convex mirror 733 and the off-axis parabolic concave mirror 734.

The off-axis parabolic concave mirrors 731 and 734 are fixed to the base plate 738. The off-axis parabolic convex mirrors 732 and 733 are fixed to the movement plate 737. The one-axis movement stage 735 can cause a change in a direction in which the distance H between the off-axis parabolic convex mirror 732 and the off-axis parabolic concave mirror 731 and the distance H between the off-axis parabolic convex mirror 733 and the off-axis parabolic concave mirror 734 are simultaneously increased or simultaneously decreased.

Specifically, the distance H between the off-axis parabolic convex mirror 732 and the off-axis parabolic concave mirror 731 and the distance H between the off-axis parabolic convex mirror 733 and the off-axis parabolic concave mirror 734 are simultaneously increased and decreased along with movement of the movement plate 737.

6.2 Operation

Figure 7:
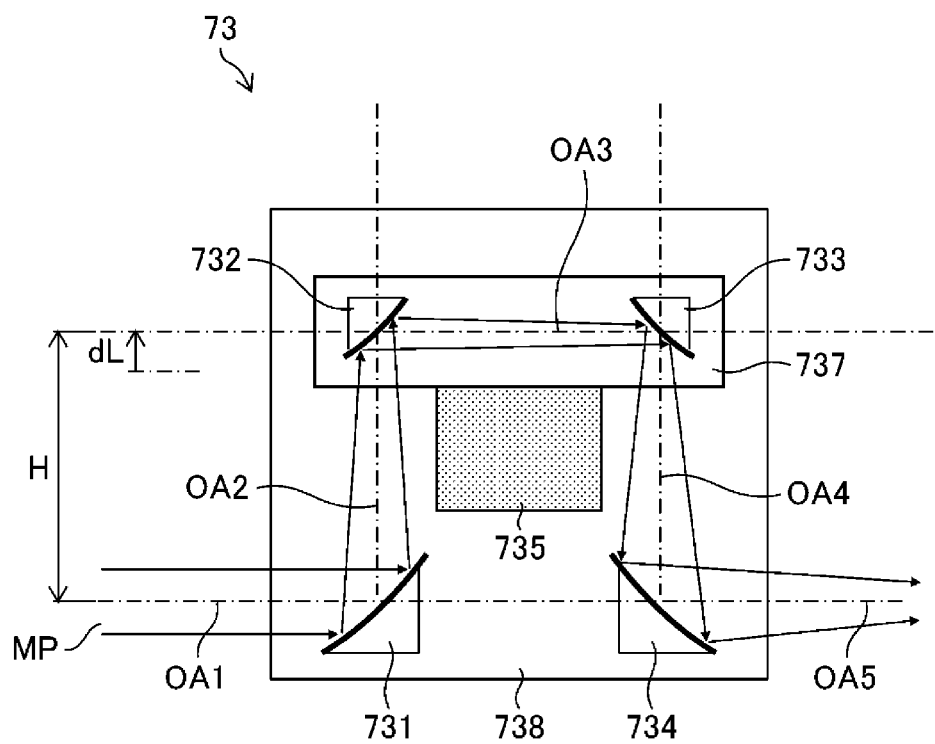
FIG. 7 illustrates a state in which a movement plate is moved away from an off-axis parabolic concave mirror in the state of the beam expander illustrated in FIG. 5.
Figure 8:
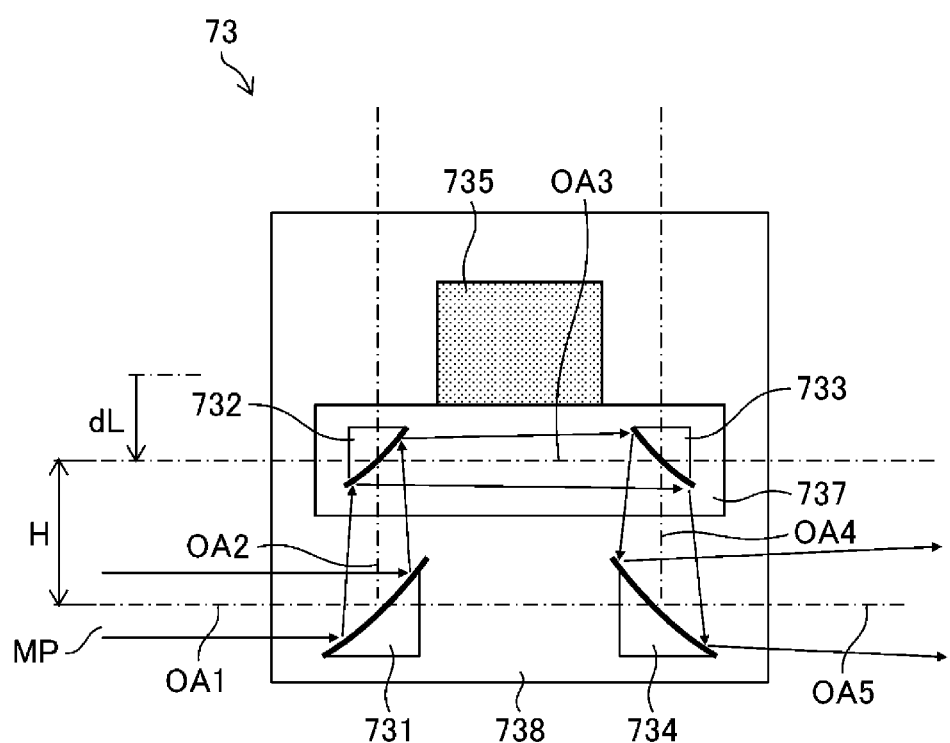
FIG. 8 illustrates a state in which the movement plate is moved closer to the off-axis parabolic concave mirror in the state of the beam expander illustrated in FIG. 5.

The following describes operation of the beam expander 73 with reference to FIGS. 5 to 8. FIG. 7 illustrates a state in which the movement plate 737 is moved away from the off-axis parabolic concave mirrors 731 and 734 in the state of the beam expander 73 illustrated in FIG. 5. FIG. 8 illustrates a state in which the movement plate 737 is moved closer to the off-axis parabolic concave mirrors 731 and 734 in the state of the beam expander 73 illustrated in FIG. 5.

In FIG. 5, the main pulse laser beam MP incident on the off-axis parabolic concave mirror 731 is parallel light. The off-axis parabolic concave mirror 731 reflects the main pulse laser beam MP so that the main pulse laser beam MP is condensed at the focal point F1.

The focal point F1 coincides with the focal point F2 of the off-axis parabolic convex mirror 732. Accordingly, the off-axis parabolic convex mirror 732 converts the main pulse laser beam MP reflected by the off-axis parabolic concave mirror 731 and traveling to be condensed at the focal point F1 into parallel light at reflection. A beam size D2 of the main pulse laser beam MP converted into the parallel light by the off-axis parabolic convex mirror 732 is minified to 1/M12 of a beam size D1 of the main pulse laser beam MP incident on the off-axis parabolic concave mirror 731. The magnification M12 is expressed in a ratio of the focal length of the off-axis parabolic concave mirror 731 and the focal length of the off-axis parabolic convex mirror 732.

The magnification M12 is f1/f2 when f1 represents the focal length of the off-axis parabolic concave mirror 731 and f2 represents the focal length of the off-axis parabolic convex mirror 732. The distance H between the off-axis parabolic concave mirror 731 and the off-axis parabolic convex mirror 732 is equal to the difference between f1 and f2.

The main pulse laser beam MP converted into the parallel light having the beam size D2 is reflected by the off-axis parabolic convex mirror 733 as a pulse laser beam diffusing from the focal point F3. Accordingly, the off-axis parabolic concave mirror 734 converts, at reflection, the pulse laser beam diffusing from the focal point F3 into parallel light having the optical axis OA5 substantially aligned with the optical axis OA1.

The beam size of the main pulse laser beam MP reflected by the off-axis parabolic convex mirror 733 and incident on the off-axis parabolic concave mirror 734 is magnified at a magnification M43. The magnification M43 is f4/f3 when f3 represents the focal length of the off-axis parabolic convex mirror 733 and f4 represents the focal length of the off-axis parabolic concave mirror 734. In a case where f1 is equal to f4 and f2 is equal to f3, the magnification M12 and the magnification M43 are equal to each other. Accordingly, a beam size D3 of the main pulse laser beam MP emitted from the off-axis parabolic concave mirror 734 is equal to the beam size D1 of the main pulse laser beam MP incident on the off-axis parabolic concave mirror 731.

Under control of the controller 58, the one-axis movement stage 735 moves the movement plate 737 relative to the base plate 738. The controller 58 increases and decreases the distance H between the off-axis parabolic concave mirror 731 and the off-axis parabolic convex mirror 732 by moving the movement plate 737. The controller 58 condenses or diverges emission light from the beam expander 73 by changing the distance H.

For example, as illustrated in FIG. 7, the controller 58 may increase the distance H in the state of FIG. 5 by dL. In this case, the divergence angle of the main pulse laser beam MP emitted from the off-axis parabolic concave mirror 734 decreases. The beam size D3 of the main pulse laser beam MP emitted from the off-axis parabolic concave mirror 734 slightly decreases as compared to the beam size D1 of the main pulse laser beam MP incident on the off-axis parabolic concave mirror 731. In addition, the optical axis OA1 of the main pulse laser beam MP incident on the off-axis parabolic concave mirror 731 and the optical axis OA5 of the main pulse laser beam MP emitted from the off-axis parabolic concave mirror 734 are aligned with each other.

Alternatively, for example, as illustrated in FIG. 8, the controller 58 may decrease the distance H in the state of FIG. 5 by dL. In this case, the divergence angle of the main pulse laser beam MP emitted from the off-axis parabolic concave mirror 734 increases. The beam size D3 of the main pulse laser beam MP emitted from the off-axis parabolic concave mirror 734 slightly increases as compared to the beam size D1 of the main pulse laser beam MP incident on the off-axis parabolic concave mirror 731. In addition, the optical axis OA1 of the main pulse laser beam MP incident on the off-axis parabolic concave mirror 731 and the optical axis OA5 of the main pulse laser beam MP emitted from the off-axis parabolic concave mirror 734 are aligned with each other.

7. Problem

Optical elements such as the high reflectance mirrors 53A to 53D in the beam transmission device 34 configured to transmit the main pulse laser beam MP are thermally deformed by the main pulse laser beam MP. When the optical elements are thermally deformed, the main pulse laser beam MP expands. As a result, part of the main pulse laser beam MP is interrupted before being transmitted to the chamber 2, and what is called "vignetting" occurs in some cases. For example, when the beam size becomes larger than a clear aperture size or exposed optical surface of any optical element, part of the beam is interrupted and vignetting occurs. The vignetting leads to reduction of the energy of the main pulse laser beam MP transmitted into the chamber 2 and reduction of the energy of EUV light.

Figure 9:
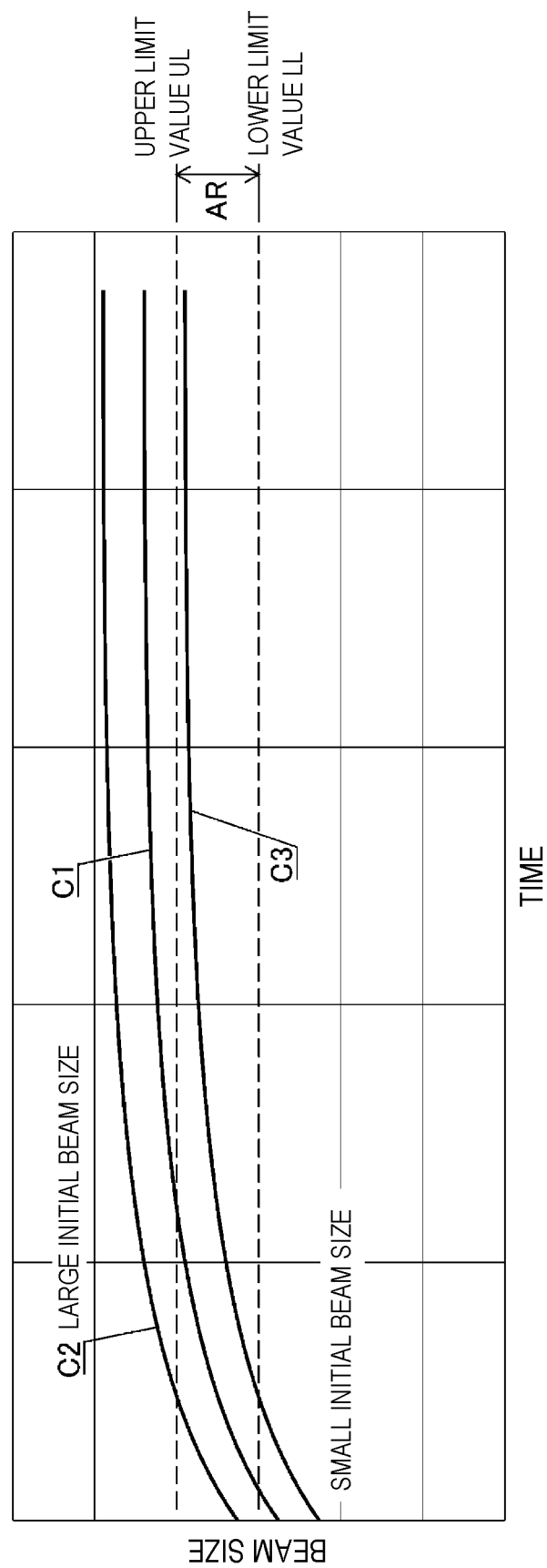
FIG. 9 is a graph illustrating the relation between elapsed time of pulse oscillation of a $CO_2$ laser beam and the beam size thereof.

FIG. 9 is a graph illustrating the relation between elapsed time of pulse oscillation of a $CO_2$ laser beam and the beam size. When an optical element is thermally deformed due to a thermal load along with irradiation with the $CO_2$ laser beam, the beam size of the $CO_2$ laser beam typically increases with elapsed time and asymptotically approaches to a predetermined value as illustrated with Curve C1 in FIG. 9.

An upper limit value UL and a lower limit value LL are provided as designed values of the beam size in some cases. In addition, a target value as an ideal beam size in designing is set between the upper limit value UL and the lower limit value LL in some cases.

The upper limit value UL of the beam size is set to be such a value that no vignetting occurs to a beam transmitted to the chamber 2. The lower limit value LL is set so that the energy density or fluence of the main pulse laser beam MP on an optical element included in the beam transmission device 34 does not exceed a damage threshold of the optical element.

When the change amount of the beam size is larger than an allowable range AR defined by the upper limit value UL and the lower limit value LL as illustrated in FIG. 9, the beam size cannot be kept within the allowable range AR only by adjusting the initial beam size in some cases (refer to Curves C2 and C3). Curve C2 corresponds to an example in which the initial beam size is adjusted to be in the allowable range AR. In this case, the beam size increases with elapsed time and eventually exceeds the upper limit value UL. Curve C3 corresponds to an example in which the initial beam size is adjusted to such a small value that an asymptotic value of the beam size is within the allowable range AR. In this case, the initial beam size is smaller than the lower limit value LL.

To keep, within the allowable range AR, the initial beam size and the beam size that increases through the optical element deformation attributable to the thermal load after time elapse, dynamic control such as "threshold control" or "proportional-integral-differential (PID) control" described below is performed in some cases.

[1] Threshold Control

The threshold control is a control method of driving the one-axis movement stage 735 of the beam expander 73 by a predetermined drive amount when the beam size has exceeded a predetermined threshold. For example, when having determined that the beam size measured by the beam monitor 66 has exceeded the upper limit value UL in FIG. 3, the controller 58 moves the one-axis movement stage 735 of the beam expander 73 by a predetermined drive amount in a predetermined moving direction so that the beam size becomes smaller than the upper limit value UL. This drive amount is determined by experiment or the like and input to the controller 58 in advance.

The threshold control is ON/OFF control in which whether to drive the one-axis movement stage 735 is selected in accordance with the magnitude relation between the measured beam size and the threshold, and thus the one-axis movement stage 735 is not driven, for example, when the beam size is equal to or smaller than the upper limit value UL. In addition, when the drive amount determined in advance is large, the one-axis movement stage 735 potentially stops moving at a position where the beam size is significantly smaller than the upper limit value UL. The beam size in this case is not necessarily close to a target value TL, and thus the accuracy of control to the target value TL depends on the drive amount determined in advance.

The accuracy of position control to the target value TL can be made high by decreasing the drive amount determined in advance, but the following performance of the control when the variation speed of the beam size is high degrades. In this manner, the threshold control is unlikely to achieve both of the control accuracy and the control following performance.

[2] PID Control

The PID control is a control method of performing feedback control of the one-axis movement stage 735 of the beam expander 73 so that the beam size measured by the beam monitor 66 becomes closer to the target value TL. The PID control is a control method using proportional control, integral control, and differential control. The controller 58 determines the drive amount of the one-axis movement stage 735 by PID, in other words, by deviation between the measured beam size and the target value, and the integral and differential thereof. PID parameters are set by experiment or the like and input to the controller 58 in advance.

In the PID control, what is called overshoot in which the movement exceeds the upper limit is likely to occur when control target variation is large as compared to the control speed. In the PID control, the target value is set to be between the upper limit value and the lower limit value. Thus, the target value becomes larger than the initial beam size in some cases. In such a case, control is performed to operate the beam expander 73 in a beam magnifying direction. Since a beam tends to expand as illustrated in FIG. 9, the beam expansion accelerates when the beam expander 73 is operated in the beam magnifying direction at an initial stage right after the beam is output, and accordingly, the beam size exceeds the upper limit value and overshoots. Even when the target value is equivalent to the initial beam size, the PID control, in which a correction amount is determined based on PID, cannot sufficiently follow control target variation and is likely to cause overshoot. In this manner, the PID control is likely to cause overshoot when the speed of control target variation is fast.

As described above, with a configuration in which any one of the control schemes, the "threshold control" or the "PID control", is employed, it has been difficult to control the beam size, the change amount of which changes. As a result, reduction of the EUV energy and damage on an optical element have occurred in some cases.

8. Embodiment 1

8.1 Configuration

The configuration of an EUV light generation system according to Embodiment 1 may be same as that in FIG. 3.

8.2 Operation

The EUV light generation system 11 according to Embodiment 1 applies two kinds of control methods to control the beam size of the main pulse laser beam MP in the burst duration. The first control method is a large drift handling control method applied when drift of the beam size is relatively large. The second control method is a small drift handling control method applied when the drift of the beam size is relatively small. The drift mainly means the change amount of the beam size. As described with reference to FIG. 9, the beam size abruptly increases right after the start of the burst duration, and thereafter, the change amount decreases with time elapse. Thus, the EUV light generation system 11 according to Embodiment 1 applies, at the start of the burst duration, the first control method in which beam size control is performed with a large control amount in a direction in which the beam size is minified. Then, after the control by the first control method, the EUV light generation system 11 according to Embodiment 1 changes a control algorithm in response to a duration in which the change amount of the beam size decreases, and applies the second control method in which beam size control is performed with a control amount smaller than that in the first control method.

Figure 10:
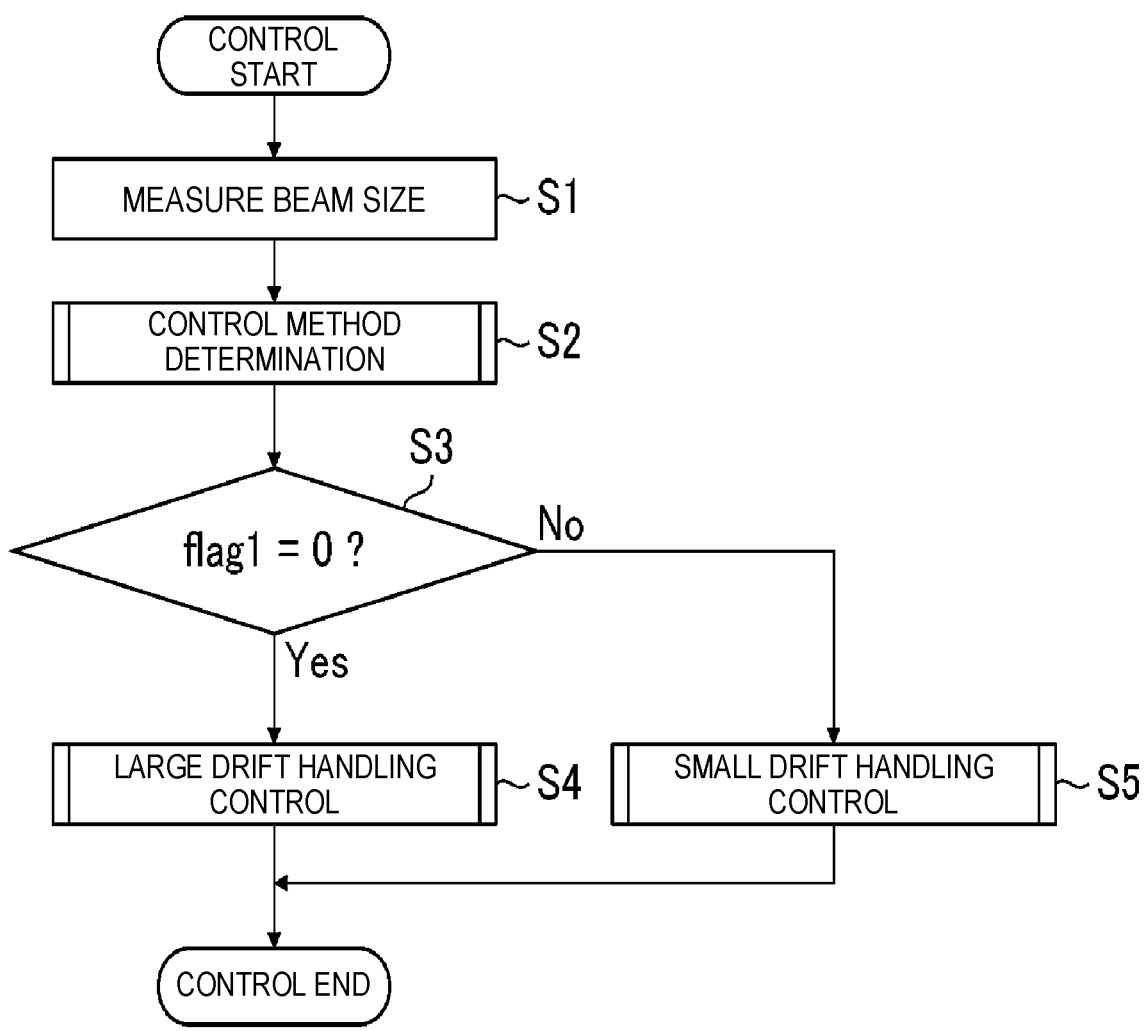
FIG. 10 is a flowchart illustrating exemplary control in Embodiment 1.

FIG. 10 is a flowchart illustrating exemplary control in Embodiment 1. Processes and operations illustrated in FIG. 10 are achieved through, for example, execution of a computer program by a processor functioning as the controller 58.

At step S1 in FIG. 10, the controller 58 measures the beam size based on data obtained from the beam monitor 66. At step S2 after the beam size measurement, the controller 58 determines a control method for controlling the beam size that varies attributable to the thermal load. Thereafter, the controller 58 switches the beam size control methods in accordance with the value of a first flag flag1 (steps S3 to S5). The first flag flag1 is a determination flag for determining the beam size control method, and indicates "0" at large drift handling or "1" at small drift handling.

In other words, at step S3, the controller 58 determines whether the value of the first flag flag1 is "0".

When the determination at step S3 is positive, in other words, in a case where flag1 is "0", the controller 58 proceeds to step S4 and performs large drift handling control. When the determination at step S3 is negative, in other words, in a case where flag1 is "1", the controller 58 proceeds to step S5 and performs small drift handling control.

After step S4 or S5, the controller 58 ends the flowchart in FIG. 10. When a burst signal is on, the controller 58 executes the flowchart in FIG. 10 again from step S1 while keeping the state of the first flag flag1 and the state of a second flag flag2.

Figure 11:
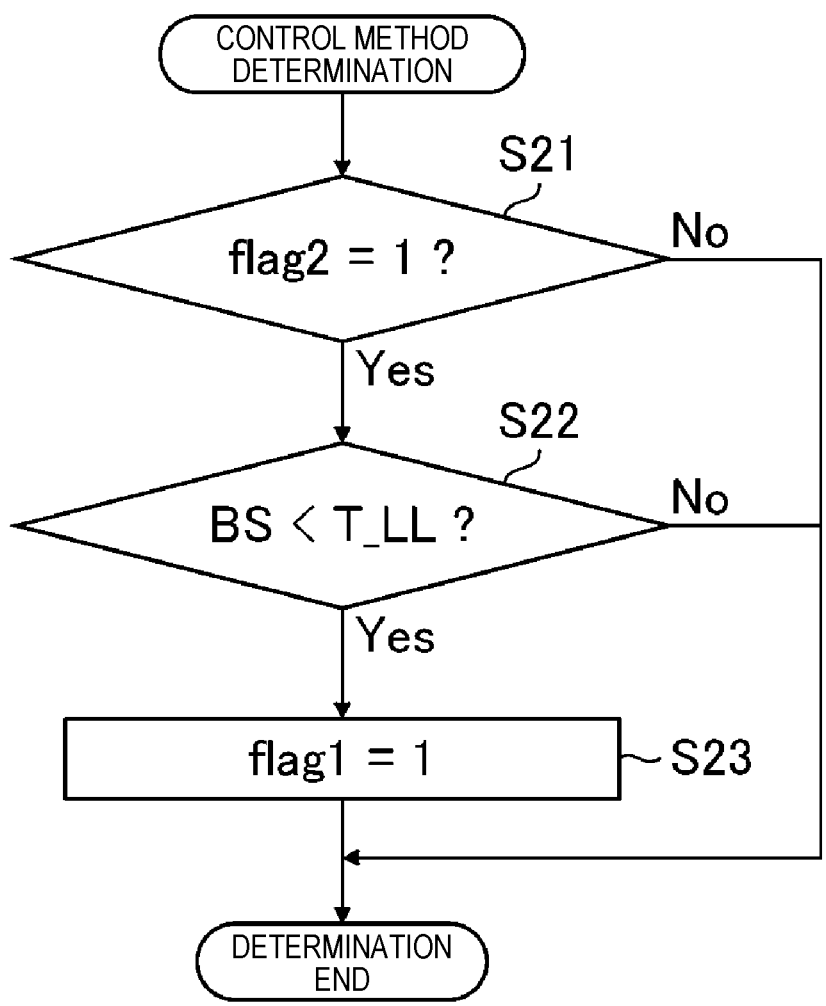
FIG. 11 is a flowchart illustrating an exemplary processing content of control method determination.

FIG. 11 is a flowchart illustrating an exemplary processing content of control method determination. The flowchart in FIG. 11 is applied to step S2 in FIG. 10.

Right after the start of the burst duration, in other words, right after the burst signal is turned on, the values of the first flag flag1 and the second flag flag2 are both set to "0". The second flag flag2 is set to "1" when the beam size has exceeded a first upper limit threshold T_UL1 as the upper limit value of the beam size in large drift.

In the subroutine illustrated in FIG. 11, when a beam size BS has exceeded the first upper limit threshold T_UL1 (flag2=1) and become smaller than a first lower limit threshold T_LL indicating that the beam size BS is small, the first flag flag1 is set to "1", and the next control transitions to the small drift handling control.

The first flag flag1 and the second flag flag2 are both set to "0" when the burst signal is turned off.

At step S21, the controller 58 determines whether the second flag flag2 is "1". When the determination at step S21 is negative, the controller 58 ends the flowchart in FIG. 11 without performing steps S22 and S23, and returns to the flowchart in FIG. 10.

When the determination at step S21 is positive, the controller 58 proceeds to step S22. At step S22, the controller 58 determines whether the beam size has become smaller than the first lower limit threshold T_LL. When the determination at step S22 is negative, the controller 58 ends the flowchart in FIG. 11 without performing step S23, and returns to the flowchart in FIG. 10.

When the determination at step S22 is positive, the controller 58 proceeds to step S23. At step S23, the controller 58 ends the flowchart in FIG. 11 after setting the first flag flag1 to "1", and returns to the flowchart in FIG. 10.

At step S3 in FIG. 10, the controller 58 determines whether the first flag flag1 is "0".

When the determination at step S3 is positive, the controller 58 proceeds to step S4 to perform the large drift handling control.

When the determination at step S3 is negative, in other words, when the first flag flag1 is "1", the controller 58 proceeds to step S5 to perform the small drift handling control.

After step S4 or S5, the controller 58 ends the flowchart in FIG. 10.

Figure 12:
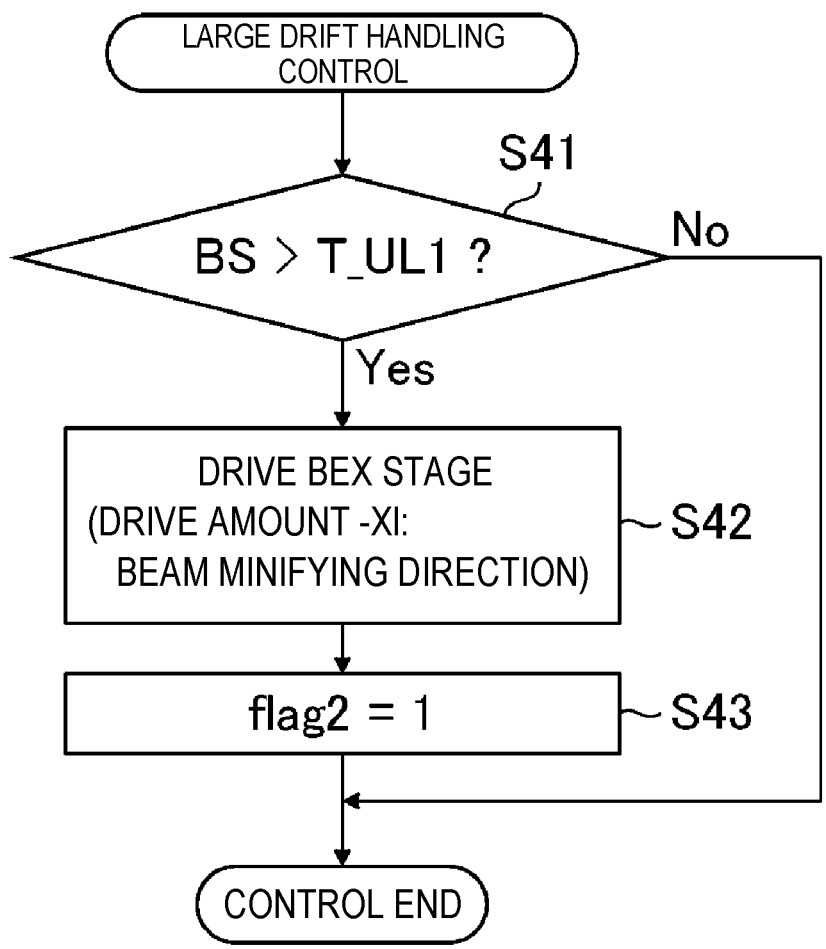
FIG. 12 is a flowchart illustrating exemplary control at large drift handling.

FIG. 12 is a flowchart illustrating exemplary control at large drift handling. The flowchart in FIG. 12 is applied to step S4 in FIG. 10. The large drift handling control method may be the threshold control. In the large drift handling control, a beam expander stage is operated in the direction in which the beam size is minified by the threshold control on the first upper limit threshold T_UL1 determined as a beam size upper limit value. The "beam expander stage" is referred to as the "BEX stage". In the present embodiment, the BEX stage is the one-axis movement stage 735 of the beam expander 73. Among moving directions of the BEX stage, the direction in which the beam size is minified is referred to as a "beam minifying direction", and the direction in which the beam size is magnified is referred to as a "beam magnifying direction".

When the beam size BS measured by the beam monitor 66 is larger than the first upper limit threshold T_UL1, the BEX stage is moved by a predetermined drive amount "−Xl". The negative sign of the drive amount indicates that the BEX stage is moved in the beam minifying direction. In addition, the second flag flag2 indicating that the beam size BS has exceeded the first upper limit threshold T_UL1 is set to "1". Each step in FIG. 12 will be described below.

At step S41, the controller 58 determines whether the beam size BS measured by the beam monitor 66 has exceeded the first upper limit threshold T_UL1.

When the determination at step S41 is positive, the controller 58 proceeds to step S42 to drive the BEX stage in the beam minifying direction. The drive amount in this case may be a fixed value and is, for example, the predetermined drive amount "−Xl".

At step S43 following step S42, the controller 58 sets the second flag flag2 to "1". After step S43, the controller 58 ends the flowchart in FIG. 12, and returns to the flowchart in FIG. 10.

When the determination at step S41 is negative, the controller 58 ends the flowchart in FIG. 12 without performing steps S42 and S43, and returns to the flowchart in FIG. 10.

Figure 13:
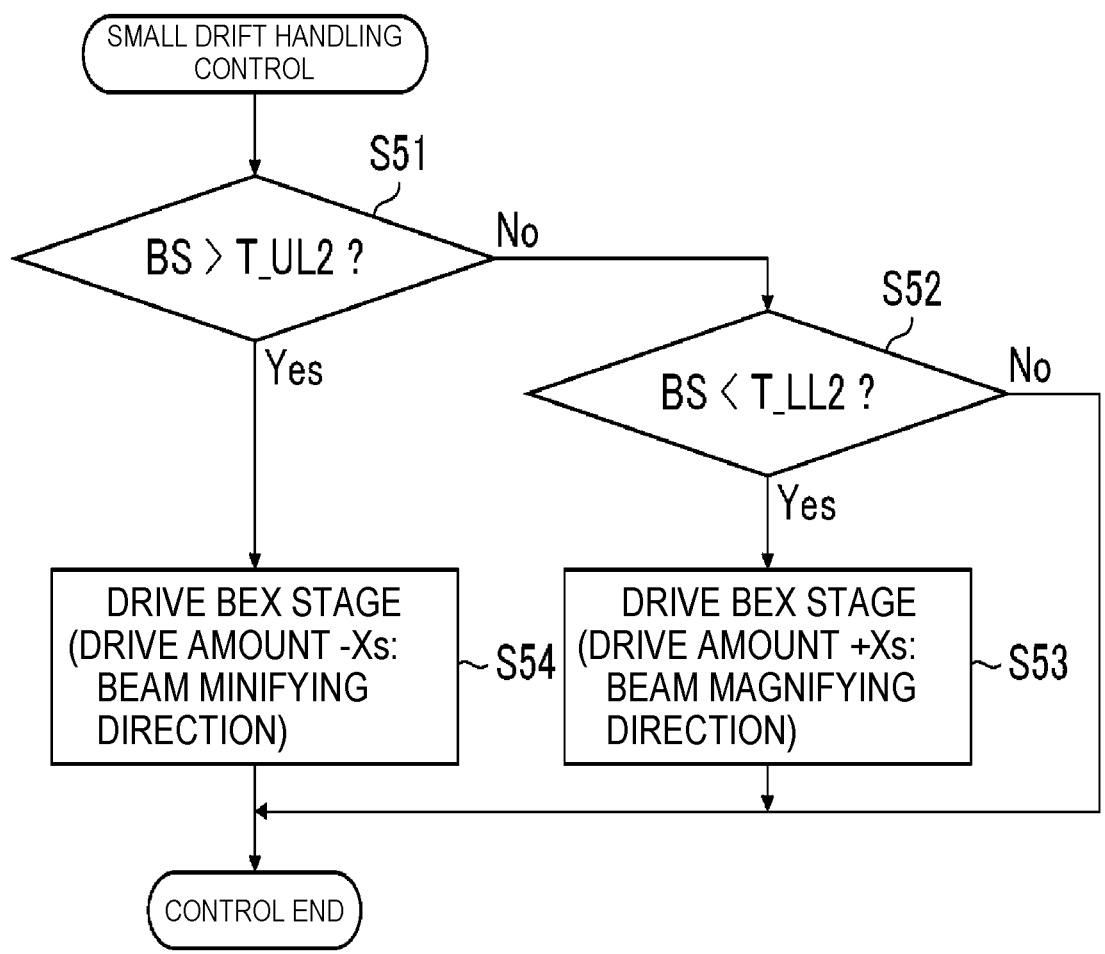
FIG. 13 is a flowchart illustrating exemplary control at small drift handling.

FIG. 13 is a flowchart illustrating exemplary control at small drift handling. The flowchart in FIG. 13 is applied to step S5 in FIG. 10. The small drift handling control sets a second lower limit threshold T_LL2 and a second upper limit threshold T_UL2 indicating an allowable range of the beam size with respect to the target value. For example, the second lower limit threshold T_LL2 may be equal to or larger than the first lower limit threshold T_LL. The second upper limit threshold T_UL2 may be smaller than the first upper limit threshold T_UL1. However, the magnitude relation between the second lower limit threshold T_LL2 and the first lower limit threshold T_LL is not particularly defined. Similarly, the magnitude relation between the second upper limit threshold T_UL2 and the first upper limit threshold T_UL1 is not defined. For example, the second upper limit threshold T_UL2 may be set to be larger than the first upper limit threshold T_UL1. In the small drift handling control, the BEX stage is operated in the beam magnifying direction to magnify the beam size when the beam size BS has become smaller than the second lower limit threshold T_LL2 determined in advance, or the BEX stage is operated in the beam minifying direction to minify the beam size when the beam size BS has exceeded the second upper limit threshold T_UL2 determined in advance.

An absolute value Xs of the drive amount of the BEX stage at small drift handling is set to be smaller than an absolute value Xl of the drive amount of the BEX stage at large drift handling (Xs<Xl) to perform minute adjustment of the beam size. Accordingly, the beam size substantially satisfies the relation T_LL2<BS<T_UL2. Each step in FIG. 13 will be described below.

At step S51, the controller 58 determines whether the beam size BS measured by the beam monitor 66 has exceeded the second upper limit threshold T_UL2.

When the determination at step S51 is negative, the controller 58 proceeds to step S52. At step S52, the controller 58 determines whether the beam size BS has become smaller than the second lower limit threshold T_LL2.

When the determination at step S52 is positive, the controller 58 proceeds to step S53 to drive the BEX stage by a predetermined drive amount "+Xs" in the beam magnifying direction. The drive amount Xs may be a fixed value determined in advance. After step S53, the controller 58 ends the flowchart in FIG. 13, and returns to the flowchart in FIG. 10.

When the determination at step S52 is negative, the controller 58 ends the flowchart in FIG. 13 without performing step S53, and returns to the flowchart in FIG. 10.

When the determination at step S51 is positive, the controller 58 proceeds to step S54. At step S54, the controller 58 drives the BEX stage by the predetermined drive amount "−Xs" in the beam minifying direction. After step S54, the controller 58 ends the flowchart in FIG. 13, and returns to the flowchart in FIG. 10.

Figure 14:
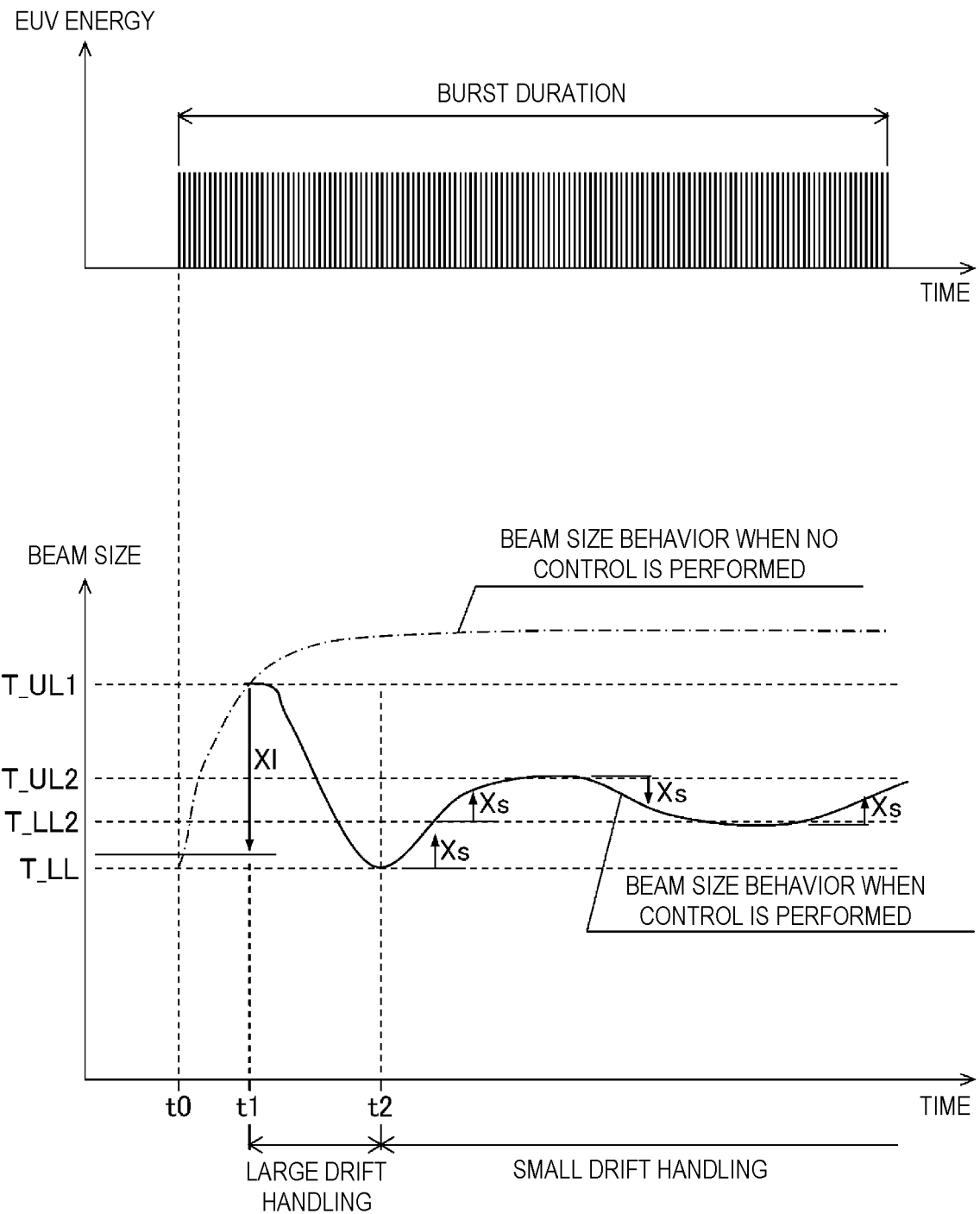
FIG. 14 illustrates exemplary behavior of the beam size in Embodiment 1.

FIG. 14 illustrates exemplary behavior of the beam size in Embodiment 1. The behavior of the beam size as illustrated in FIG. 14 is obtained when the flowcharts illustrated in FIGS. 10 to 13 are executed.

A graph illustrated with a dashed and single-dotted line in FIG. 14 represents the behavior of the beam size when the beam size control is not performed (when no control is performed). A graph illustrated with a solid line in FIG. 14 represents the behavior of the beam size when the control described with reference to FIGS. 10 to 13 is performed. The behavior of the beam size while the BEX stage is not driven when the control is performed is illustrated with a dashed and single-dotted line in some cases.

The control of the flowchart in FIG. 10 may be started at start time t0 at which the burst signal is turned on in FIG. 14. After the start of the burst duration, the beam size abruptly increases from the initial value. The initial value of the beam size (initial beam size) right after the start of the burst duration is set to be equal to or larger than the first lower limit threshold T_LL. The initial beam size is preferably set to a value close to the first lower limit threshold T_LL. When the beam size exceeds the first upper limit threshold T_UL1 at time t1 after the burst signal is turned on, the BEX stage is driven by the drive amount "−Xl" in the beam minifying direction by the threshold control at large drift handling. Accordingly, the beam size is gradually minified.

When the beam size has become smaller than the first lower limit threshold T_LL eventually at time t2, the BEX stage is driven by the drive amount "+Xs" in the beam magnifying direction by the small drift handling control. Accordingly, the beam size is magnified. Thereafter, the BEX stage is finely controlled by the drive amount "+Xs" or "−Xs" in accordance with the small drift handling control (FIG. 13). Accordingly, the beam size is adjusted to substantially become equal to a value in the range of the second lower limit threshold T_LL2 to the second upper limit threshold T_UL2. The target value is included in the range of the second lower limit threshold T_LL2 to the second upper limit threshold T_UL2.

The main pulse laser apparatus 33 in Embodiment 1 is an exemplary "pulse laser apparatus" in the present disclosure. The two-dimensional image sensor 663 of the beam monitor 66 is an exemplary "sensor" in the present disclosure. A measured value obtained from the beam monitor 66 is exemplary "detection information" in the present disclosure. The one-axis movement stage 735 of the beam expander 73 is an exemplary "actuator" in the present disclosure. The off-axis parabolic convex mirrors 732 and 733 of the beam expander 73 are each an exemplary "second optical element" in the present disclosure. The plasma generation region 25 is an exemplary "predetermined region" in the present disclosure. The large drift handling control method is an exemplary "first algorithm" in the present disclosure. The magnitude of the drive amount of the BEX stage "−Xl" at the large drift handling control is an exemplary "first control amount" in the present disclosure. The small drift handling control method is an exemplary "second algorithm" in the present disclosure. The magnitude of the drive amount of the BEX stage "+Xs" or "−Xs" at the small drift handling control is an exemplary "second control amount" in the present disclosure. The high reflectance mirrors 53A to 53D of the beam transmission device 34 are each an exemplary "first optical element" in the present disclosure. The control method indicated by the flowcharts of FIGS. 10 to 13 is an exemplary "laser beam size controlling method" in the present disclosure.

8.3 Effect

According to Embodiment 1, the large drift handling control is applied in a duration in which the beam size variation due to the thermal load is large, and thereafter, the small drift handling control is applied in a duration in which the beam size gradually becomes closer to an asymptotic value.

At large drift handling, the first control amount is applied in the direction in which the beam size is minified, and at small drift handling, control with the second control amount in the beam magnifying direction or the beam minifying direction is performed so that the beam size becomes equal to a value within a predetermined range. In this case, the first control amount is set to be larger than the second control amount in accordance with large variation of the beam size right after the start of the burst duration.

At large drift handling, the threshold control may be applied in the direction in which the beam size is minified, and at small drift handling, feedback control may be applied so that the beam size becomes equal to a value in a predetermined range.

In this manner, the control methods are switched in accordance with the change amount of the beam size in the burst duration. Thus, beam size variation in the burst duration, which has been difficult to handle with one control method, can be reduced, and accordingly, reduction of the EUV energy and damage on an optical element can be reduced.

8.4 Modification 1 of Control Method Determination

The condition under which the first flag flag1 is set to "1" is not limited to the example described with reference to FIG. 11. For example, the first flag flag1 may be set to "1" when the gradient of temporal change of the beam size has become smaller than a predetermined value. The gradient of temporal change of the beam size is the change amount of the beam size per time unit, and indicates a speed at which the beam size changes, in other words, a beam magnifying speed.

Figure 15:
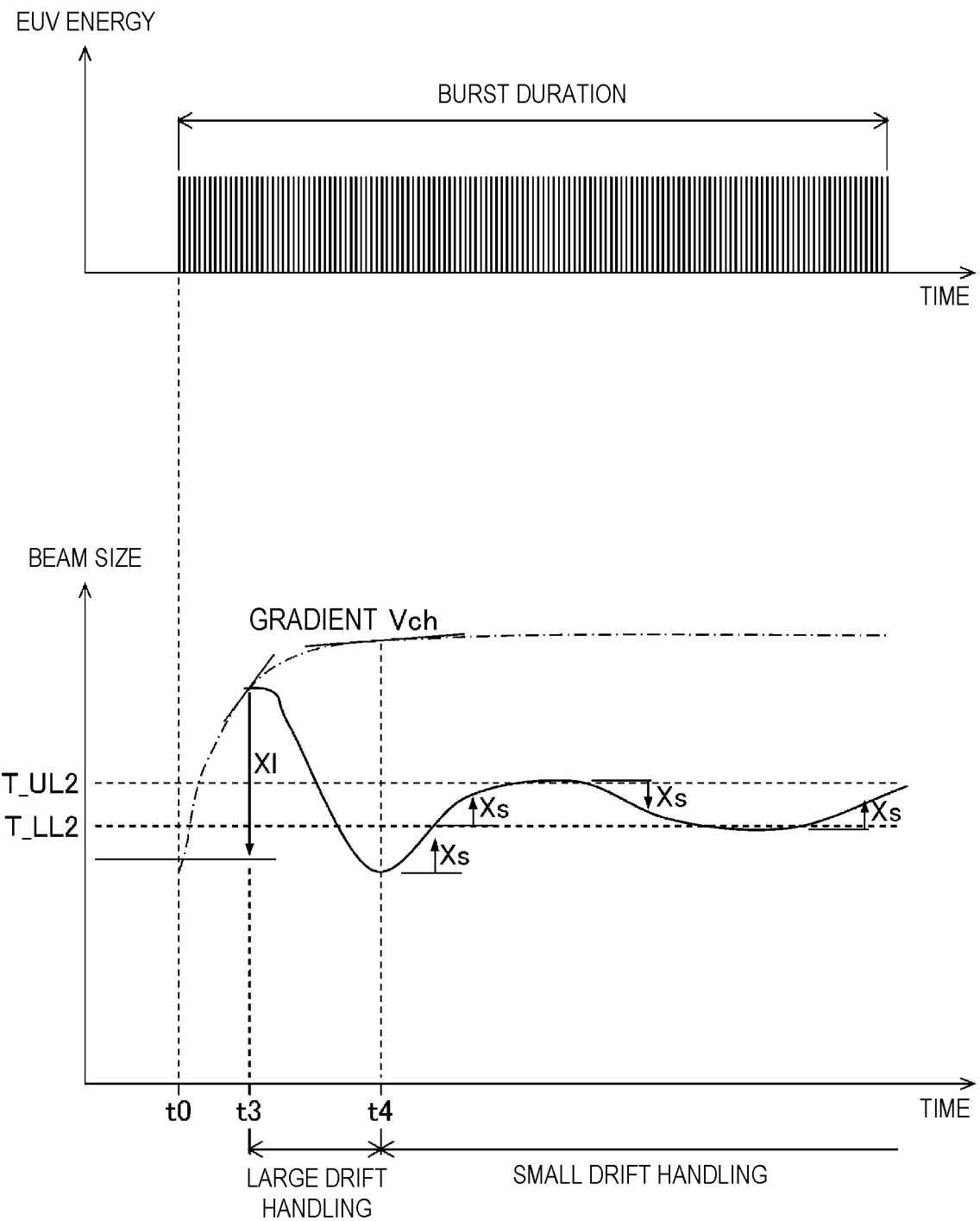
FIG. 15 illustrates exemplary behavior of the beam size in Modification 1.

FIG. 15 illustrates exemplary behavior of the beam size in Modification 1. For example, the control of the flowchart in FIG. 10 is taken to be one cycle, and the controller 58 calculates, from each of the previous control and the current control, the beam size when the beam size control is not performed. Then, the controller 58 calculates a beam magnifying speed Vb by an expression below from the beam size when the beam size control is not performed.

$$Vb = (\text{"current beam size"} - \text{"previous beam size"}) / \text{"control period"}$$

The controller 58 compares the calculated Vb with a threshold Vch determined in advance, and when Vb<Vch holds, the controller 58 may determine that the drift amount (change amount) of the beam size when the beam size control is not performed has decreased, and may set the first flag flag1 to "1".

In the case of FIG. 15, the BEX stage is driven by the drive amount "−Xl" in the beam minifying direction by the threshold control at large drift handling at time t3. Thereafter, Vb<Vch holds after time t4, and the control is switched to the small drift handling control. Time t3 may be same as time t1 in FIG. 14.

The beam size when the beam size control is not performed may be calculated as follows. When BS[n] represents the beam size at time n and BE[n] represents a beam minifying degree of the beam expander 73 at time n, the beam size when the beam size control is not performed is given by BS[n]−BE[n]. The "beam minifying degree" is an amount by which the beam expander 73 minifies the beam size by the control, and is expressed in units of negative length. Accordingly, the beam minifying degree depends on the position of the one-axis movement stage 735 of the beam expander 73. The beam minifying degree of the beam expander 73 is simply referred to as the "minifying degree" in some cases.

The beam magnifying speed Vb indicating the gradient of temporal change of the beam size at time n when the beam size control is not performed is expressed in Expression (1) below.

$$Vb = \{(BS[n] - BE[n]) - (BS[n-1] - BE[n-1])\}/\Delta t \quad (1)$$

In the expression, $\Delta t$ represents elapsed time from time n−1 to time n.

The controller 58 may determine whether to rewrite the value of the first flag flag1 based on the magnitude relation between the value Vb and the threshold Vch.

The beam magnifying speed Vb is an exemplary "first beam magnifying speed" in the present disclosure. The elapsed time $\Delta t$ is an exemplary "predetermined time interval" in the present disclosure. The threshold Vch is an exemplary "first threshold" in the present disclosure.

8.5 Modification 2 of Control Method Determination

The controller 58 may measure elapsed time from the start of the burst duration, and may set the first flag flag1 to "1" when the elapsed time from the start of the burst duration has exceeded a threshold Tch determined in advance. Alternatively, the number of times of measurement of the beam size or the number of times of control when the control of the flowchart in FIG. 10 is taken to be one cycle may be used in place of the elapsed time.

Figure 16:
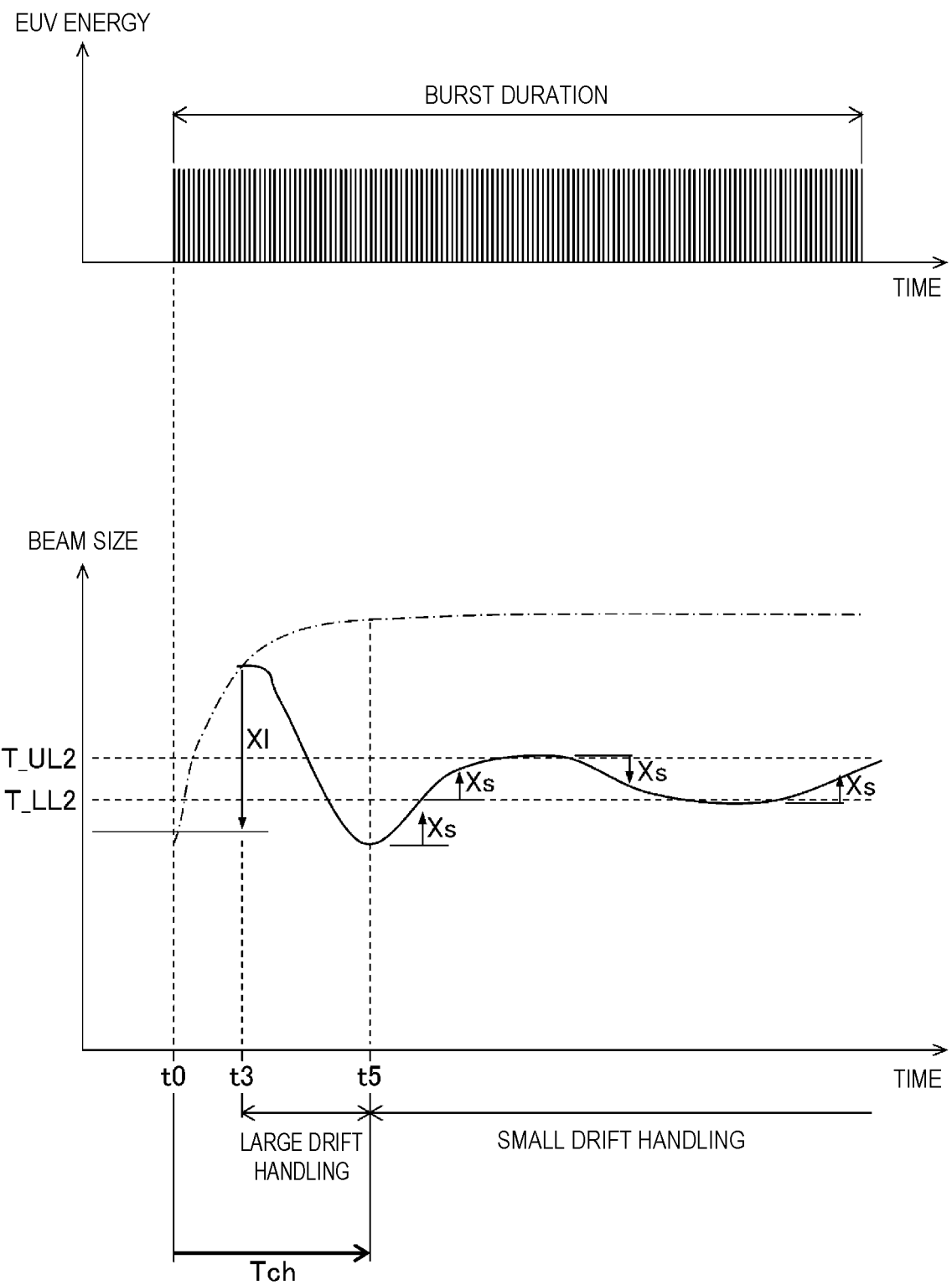
FIG. 16 illustrates exemplary behavior of the beam size in Modification 2.

FIG. 16 illustrates exemplary behavior of the beam size in Modification 2. In the case of FIG. 16, at time t5, the elapsed time from the start of the burst duration exceeds the threshold Tch determined in advance, and the control is switched to the small drift handling control.

An exemplary preferable range of the threshold Tch indicating the elapsed time from the start of the burst duration, which defines the timing of switching from the large drift handling control (first control method) to the small drift handling control (second control method) is, for example, 50 ms Tch 200 ms.

The elapsed time from the start of the burst duration is an exemplary "first elapsed time" in the present disclosure. The threshold Tch is an exemplary "second threshold" in the present disclosure.

9. Embodiment 2

9.1 Configuration

The configuration of an EUV light generation system according to Embodiment 2 may be same as that in FIG. 3.

9.2 Operation The following describes any difference of operation in Embodiment 2 from that in Embodiment 1.

9.2.1 Control Method at Large Drift Handling

The absolute value Xl of the drive amount of the BEX stage in the large drift handling control is not limited to a fixed value but may be adaptively set in accordance with the beam magnifying speed. For example, the controller 58 calculates the beam magnifying speed Vb from the beam size measured when the first flag flag1 is "0" and the beam size measured in the previous control, and sets the absolute value Xl of the drive amount of the BEX stage in accordance with Expression (2) below.

$$Xl = Xl0 + f(Vb) \qquad (2)$$

In the expression, Xl0 represents a constant, and f(Vb) represents a function of Vb. An expression that calculates Vb may be same as Expression (1). A beam magnifying speed Vbs used in Expression (2) is calculated by using the value of the beam size measured by the beam monitor 66 in a duration before the start of drive of the BEX stage by the large drift handling control in the burst duration.

Alternatively, a table may be used in place of the function of Expression (2).

The function of Expression (2) is an exemplary "first function" in the present disclosure. The table used in place of the function of Expression (2) is another exemplary "first table" in the present disclosure. The beam magnifying speed Vb used in Expression (2) is an exemplary "second beam magnifying speed" in the present disclosure.

9.2.2 Control Method at Small Drift Handling

Figure 17:
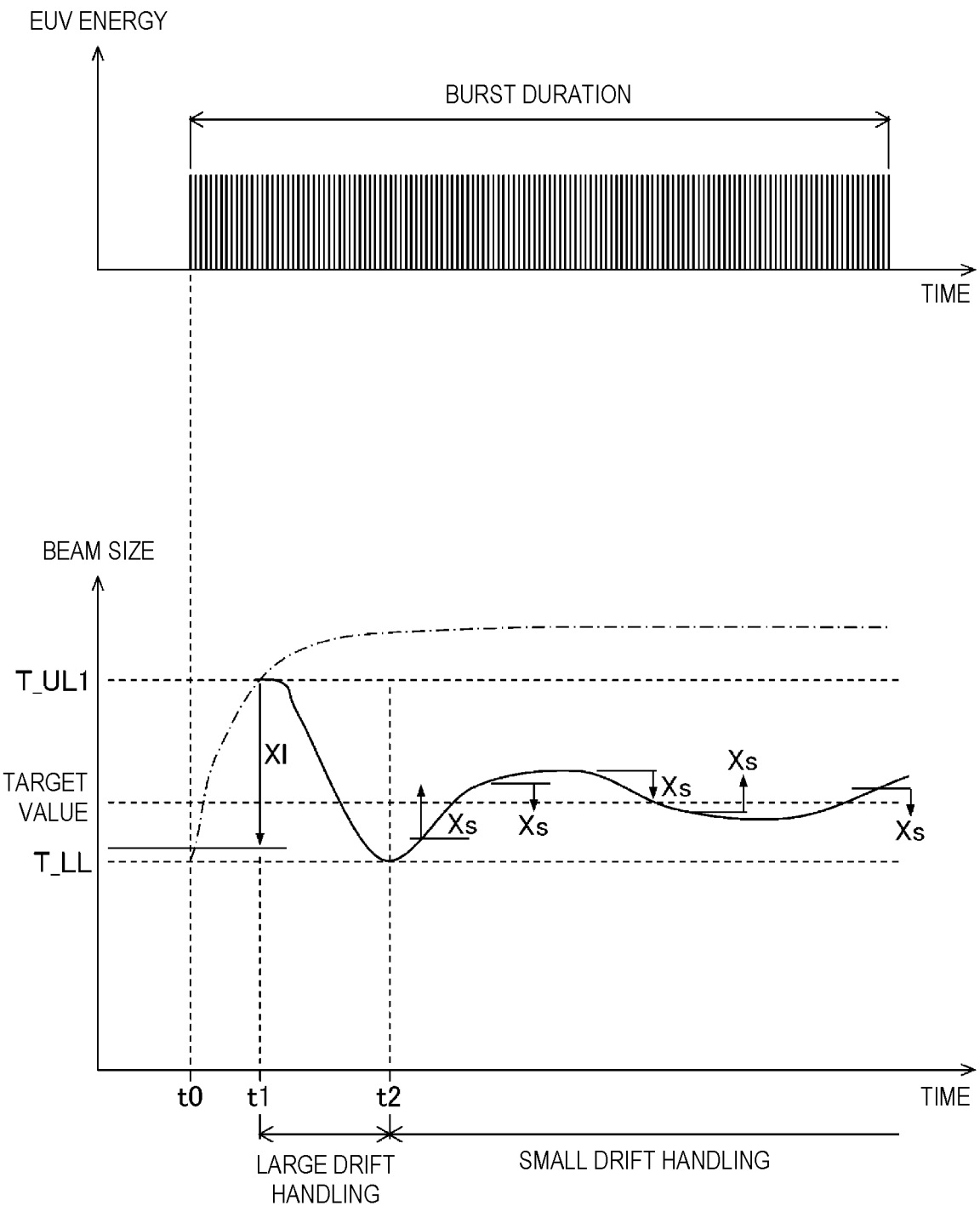
FIG. 17 illustrates exemplary behavior of the beam size in Embodiment 2.

The small drift handling control method in Embodiment 2 may be the PID control. FIG. 17 illustrates exemplary behavior of the beam size in Embodiment 2. For example, the controller 58 sets the target value of the beam size and controls the beam size to the target value by the PID control.

The controller 58 may calculate the beam magnifying speed Vbs from the beam size measured in the previous control and the beam size measured in the current control, and may calculate the absolute value Xs of the drive amount of the BEX stage by Expression (3) below.

$$Xs = Xs0 + g(Vbs) \qquad (3)$$

In the expression, Xs0 represents a constant, and g(Vbs) represents a function of Vbs. An expression that calculates Vbs may be same as Expression (1) that calculates Vb. The beam magnifying speed Vbs is calculated by using the value of the beam size measured by the beam monitor 66 after drive of the BEX stage by the large drift handling control in the burst duration.

A table may be used in place of the function of Expression (3).

The function of Expression (3) is an exemplary "second function" in the present disclosure. The table used in place of the function of Expression (3) is another exemplary "second table" in the present disclosure. The beam magnifying speed Vbs used in Expression (3) is an exemplary "third beam magnifying speed" in the present disclosure. The beam magnifying speed Vbs is calculated by using the value of the beam size measured by the beam monitor 66 after drive of the BEX stage by the large drift handling control in the burst duration.

9.3 Effect

According to Embodiment 2, the control methods are switched in accordance with the change amount of the beam size in the burst duration. Thus, beam size variation in the burst duration, which has been difficult to handle with one control method, can be reduced, and accordingly, reduction of the EUV energy and damage on an optical element can be reduced.

In addition, according to Embodiment 2, since the drive amount of the BEX stage is adaptively set to an appropriate value in accordance with the beam magnifying speed, the beam size can be adjusted more accurately than in Embodiment 1.

Figure 18:
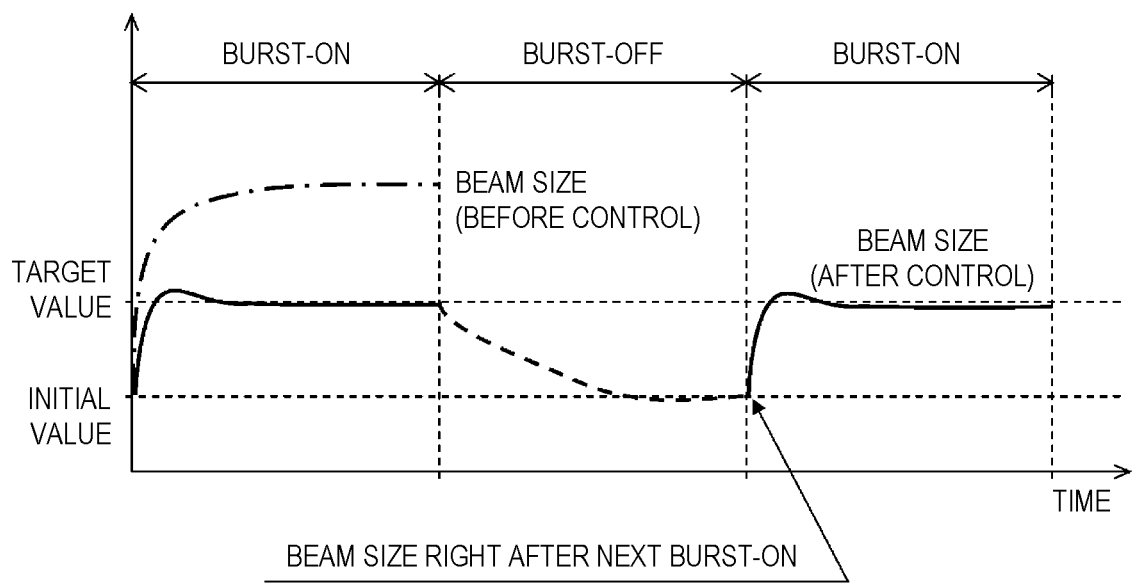
FIG. 18 is a graph illustrating exemplary beam size variation in a burst stop duration.

10. Summary of Control with Beam Size Recovery Characteristic in Burst Stop Duration Taken into Account FIG. 18 is a graph illustrating exemplary beam size variation in the burst stop duration. The horizontal axis represents time, and the vertical axis represents the beam size. The duration of "burst-on" means the "burst duration", and the duration of "burst-off" means the "burst stop duration". The term "burst-off" is synonymous with "burst stop". A graph illustrated with a dashed and single-dotted line in FIG. 18 represents the behavior of the beam size when the beam size control is not performed (when no control is performed). A graph illustrated with a solid line in FIG. 18 represents the behavior of the beam size when the control described with reference to FIGS. 10 to 17 is performed.

The thermal load on an optical element of the beam transmission device 34 is reduced through the burst-off, and thus, right after the burst-off, the beam size starts gradually recovering and returning to the initial value. When the burst-off time is sufficiently long, the beam size returns to the initial value as illustrated in FIG. 18. In this case, the beam size at the next burst-on is appropriately controlled.

Figure 19:
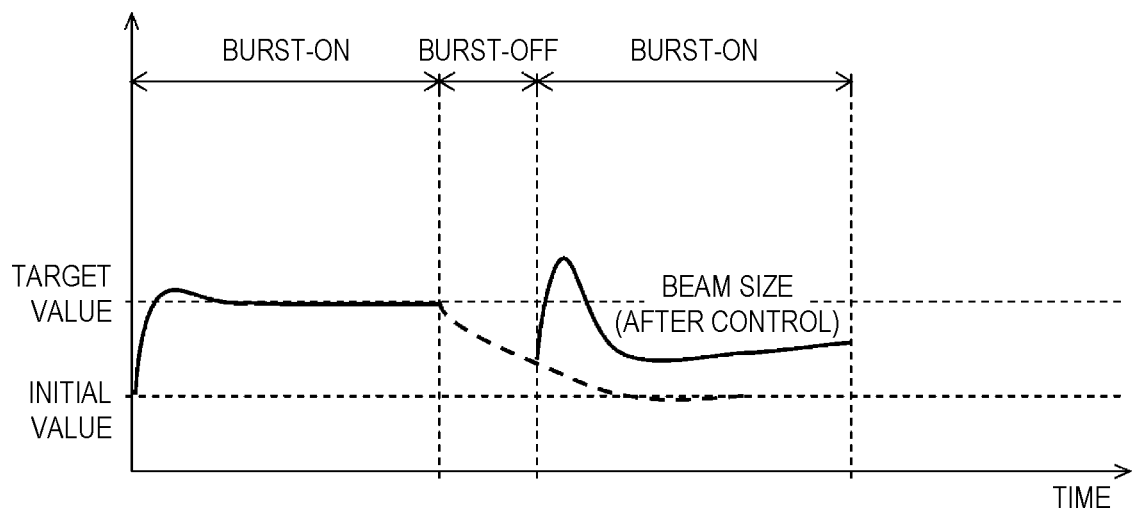
FIG. 19 illustrates exemplary behavior of the beam size when a burst-off time is short.

However, when the burst-off time is relatively short, the beam size does not return to the initial value in some cases (refer to FIG. 19).

FIG. 19 illustrates exemplary behavior of the beam size when the burst-off time is short. When the burst-off time is short, the next burst-on is started at a timing halfway through the returning of the beam size to the initial value. In this case, as illustrated in FIG. 19, the beam size in the burst-on started in the state of the beam size not completely returning to the initial value potentially becomes too small through the large drift handling control to reach the target value.

The beam size recovery characteristic (recovery characteristic) during the burst-off is different when the laser energy during the burst-on and the repetition frequency are different. For example, in a case of an irradiation condition with a relatively low thermal load, the beam size returns to the initial value in some cases even when the burst-off time is short (refer to FIG. 20).

Figure 20:
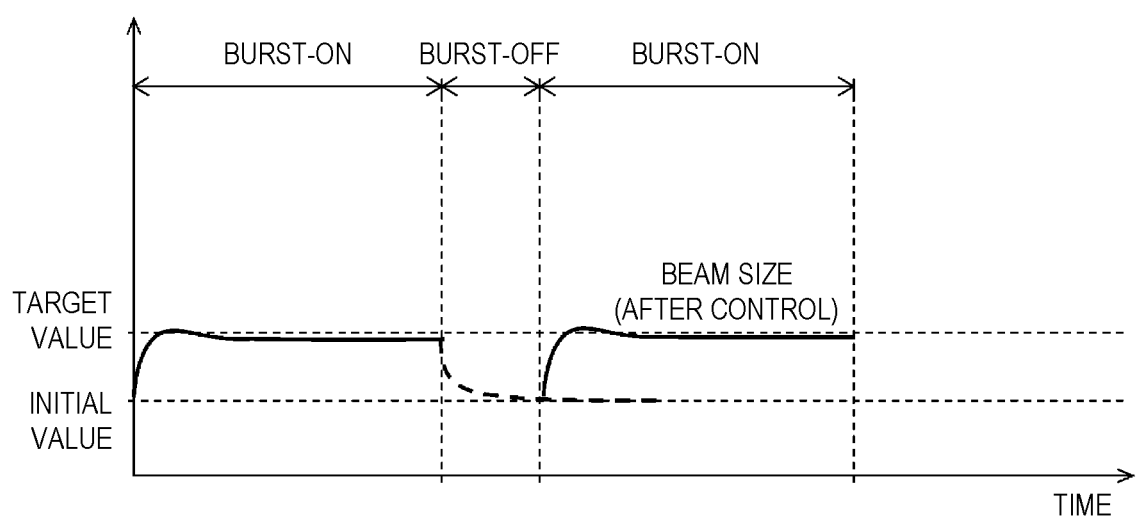
FIG. 20 illustrates exemplary behavior of the beam size when the burst-off time is short.

FIG. 20 illustrates exemplary behavior of the beam size when the burst-off time is short. FIG. 20 illustrates an example in which the beam size recovery characteristic in the burst-off is different from that in the example of FIG. 19 and the beam size returns to the initial value in a time shorter than that in the example of FIG. 19.

For example, in a case of an irradiation condition with a thermal load lower than that in the example of FIG. 19, the beam size returns to the original initial value even when the burst-off time is short as illustrated in FIG. 20. In this case, the beam size in the next burst-on is appropriately controlled.

To appropriately control the beam size in the next burst-on irrespective of the length of the burst-off time, the beam size recovery characteristic may be acquired in advance at the burst-off.

Figure 21:
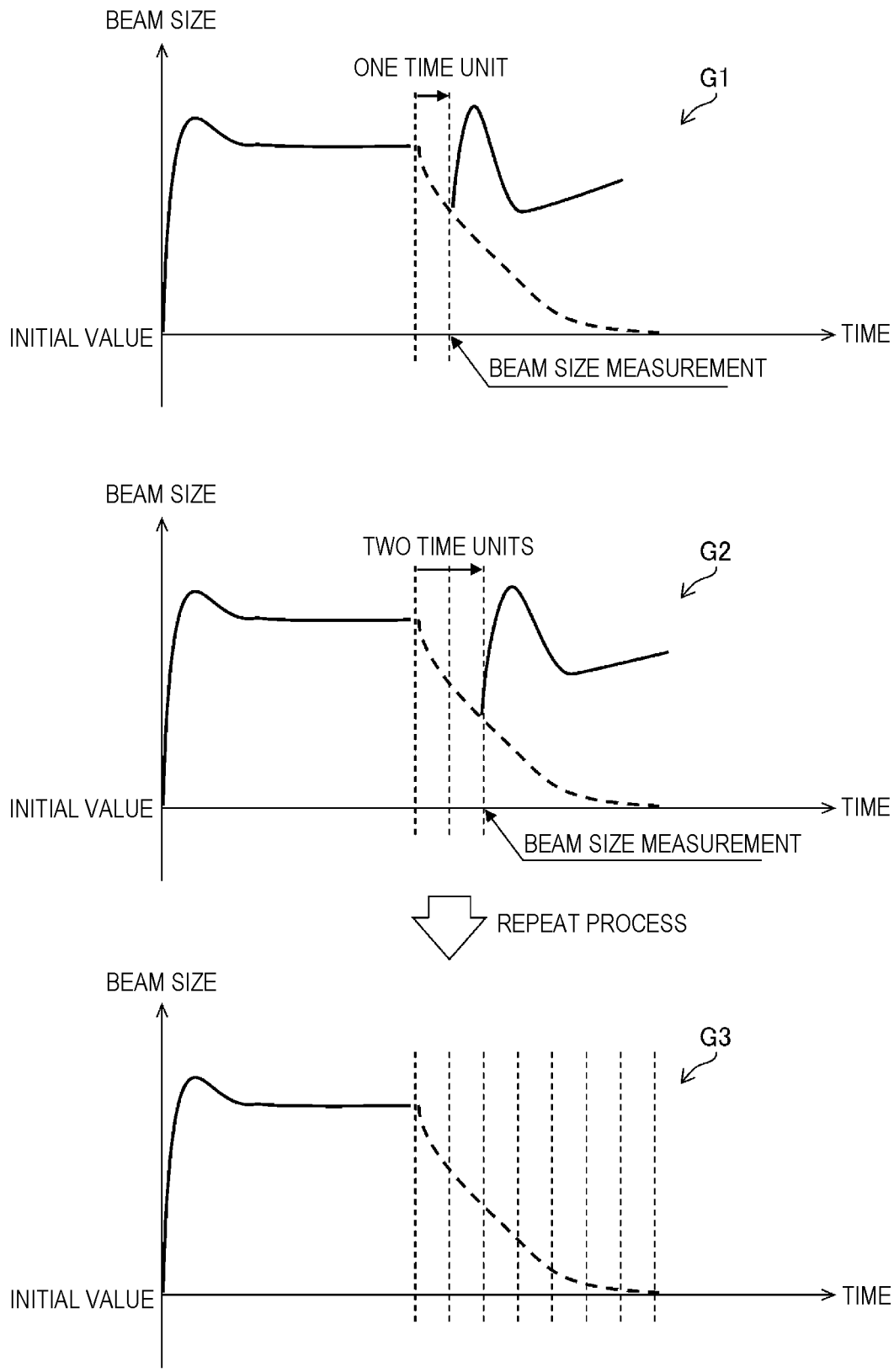
FIG. 21 is an explanatory diagram illustrating an exemplary method of acquiring recovery characteristic data.

FIG. 21 is an explanatory diagram illustrating an exemplary method of acquiring recovery characteristic data. The recovery characteristic under an irradiation condition may be acquired as follows.

[Procedure 1] As in Graph G1 illustrated in the uppermost part of FIG. 21, the controller 58 resumes main pulse laser beam irradiation after one time unit has elapsed since the timing of the burst-off, and simultaneously measures the beam size and stores the beam size together with the elapsed time since the burst-off. The main pulse laser beam irradiation for data acquisition may be performed in shots with which the beam size measurement can be performed in the initial stage of the irradiation.

[Procedure 2] Subsequently, as in Graph G2 illustrated in the middle part of FIG. 21, the controller 58 resumes the main pulse laser beam irradiation after two time units have elapsed since the timing of the burst-off, and simultaneously measures the beam size and stores the beam size together with the elapsed time since the burst-off.

[Procedure 3] Thereafter, the controller 58 changes the elapsed time since the timing of the burst-off to "three time units", "four time units", "five time units", . . . , and repeats the above-described processing. Dashed lines in the longitudinal direction in Graph G3 illustrated in the lower part of FIG. 21 represent timings up to seven time units. In this manner, data of the beam size for each time unit corresponding to the elapsed time since the burst-off is obtained. For example, an approximate curve of the data is taken as the recovery characteristic. The approximate curve may be obtained by fitting of the curve obtained through actual measurement in FIG. 21. Typically, an exponential function may be used as the approximate curve.

Alternatively, instead of performing the above-described beam size measurement upon irradiation resuming for each time unit, a plurality of beam sizes each corresponding to the elapsed time since the burst-off may be acquired to obtain an approximate curve. In this manner, recovery characteristic data indicating the correspondence relation between the elapsed time since the burst-off and the beam size is obtained.

The controller 58 determines the minifying degree of the beam expander 73 during the burst-off in accordance with the acquired beam size recovery characteristic at the burst-off.

The minifying degree may be the stage position of the beam expander 73, and the controller 58 holds in advance a table or function that specifies the relation between the elapsed time and the minifying degree in accordance with the recovery characteristic, and applies the minifying degree in accordance with the elapsed time. The stage position may be an absolute position or a relative position.

Figure 22:
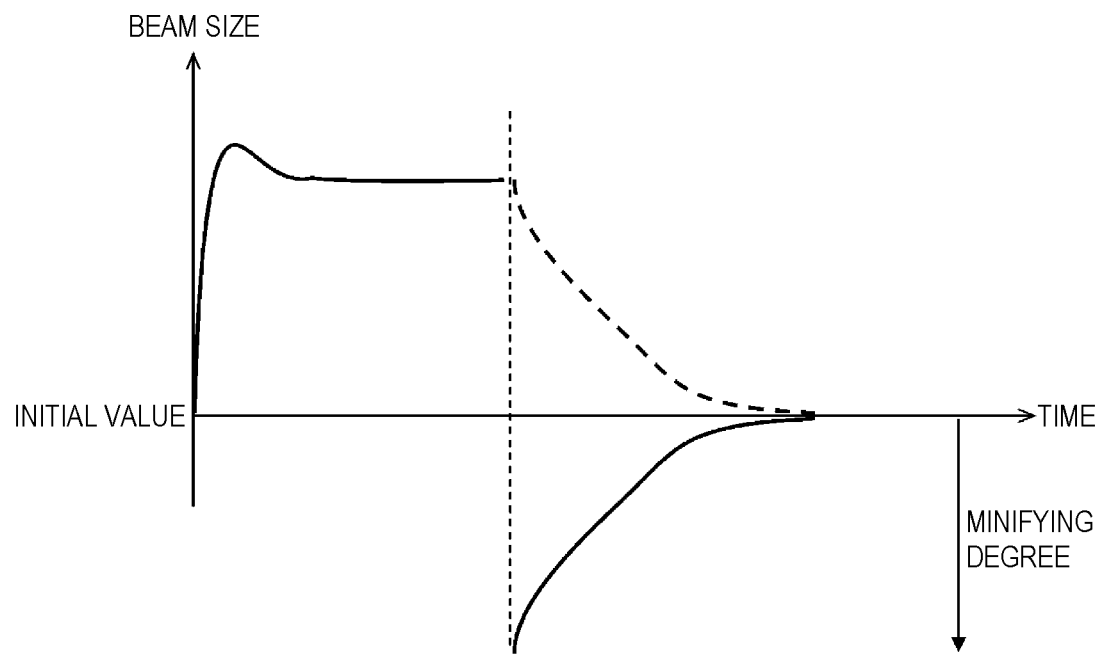
FIG. 22 illustrates an exemplary minifying degree in burst-off determined in accordance with a beam size recovery characteristic at burst-off.

FIG. 22 illustrates an exemplary minifying degree during the burst-off determined in accordance with the beam size recovery characteristic at the burst-off.

Figure 23:
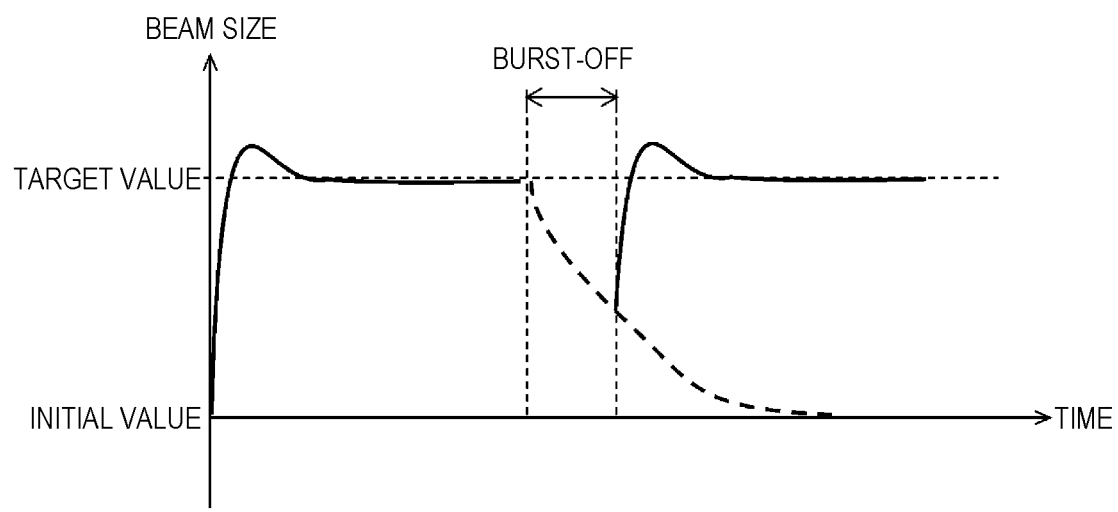
FIG. 23 illustrates exemplary behavior of the beam size at the next burst-on when a minifying degree in accordance with elapsed time is applied at burst-off.
Figure 24:
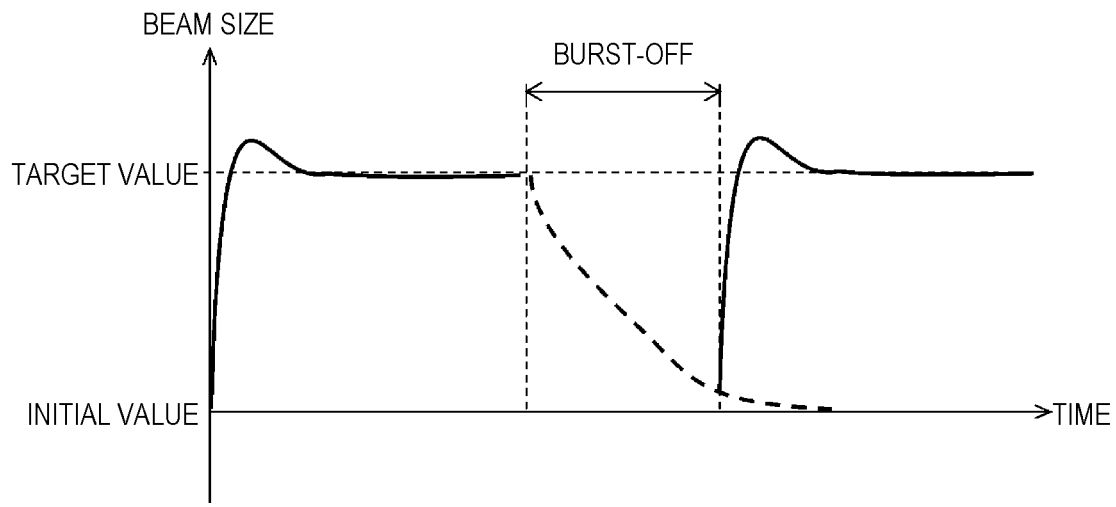
FIG. 24 illustrates exemplary behavior of the beam size at the next burst-on when the minifying degree in accordance with elapsed time is applied at burst-off.

FIGS. 23 and 24 each illustrate exemplary behavior of the beam size at the next burst-on when the minifying degree in accordance with the elapsed time is applied at the burst-off.

As illustrated in FIGS. 23 and 24, when the minifying degree in accordance with the elapsed time is applied, the beam size can be corrected to become closer to the target value irrespective of the length of the burst-off time. In this manner, the BEX stage may be driven to compensate a virtual beam size halfway through recovery during the burst-off, thereby preparing for the next burst-on.

10.1 Exemplary Control 1

Figure 25:
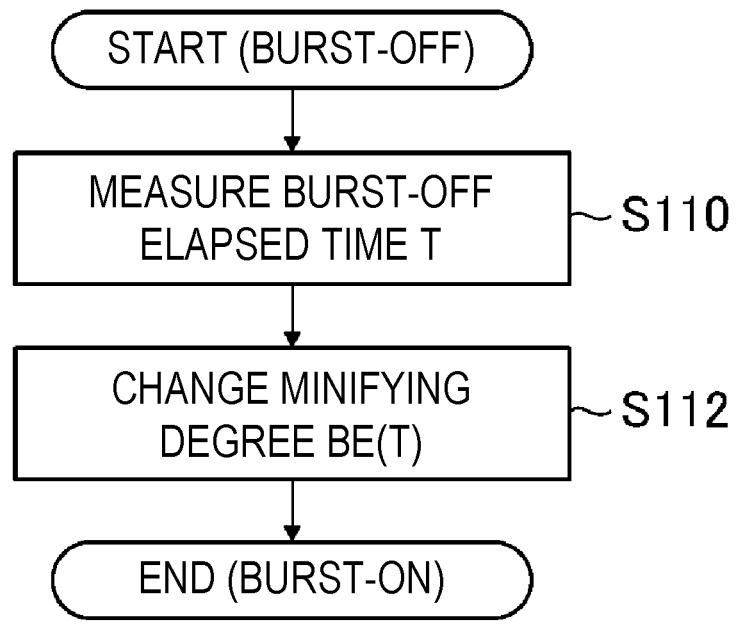
FIG. 25 is a flowchart illustrating exemplary control when the minifying degree in accordance with elapsed time is applied at burst-off.

FIG. 25 is a flowchart illustrating exemplary control when the minifying degree in accordance with the elapsed time at the burst-off is applied.

The controller 58 starts control in accordance with the flowchart in FIG. 25 at the timing of the burst-off. At step S110, the controller 58 measures elapsed time T since the burst-off. The elapsed time T is an exemplary "second elapsed time" in the present disclosure.

Then, at step S112, the controller 58 applies a minifying degree BE(T) in accordance with the elapsed time T as needed. The minifying degree BE(T) is provided as a function of the elapsed time T. The function of the minifying degree BE(T) in accordance with the elapsed time T is an exemplary "third function" in the present disclosure.

Thereafter, the controller 58 ends the flowchart in FIG. 25 at the timing of the burst-on, and transitions to the control in the burst duration described in Embodiment 1 or Embodiment 2.

Thereafter, at each burst-off, the controller 58 executes the control of the flowchart in FIG. 25. The burst-off may be determined by using a gate signal with which an external device instructs the burst operation. The controller 58 receives the gate signal from the external device through the EUV light generation control unit 5. The external device may be, for example, the exposure apparatus 6.

10.1.1 Modification

The recovery characteristic data may be held as a table of the minifying degree for the elapsed time T. This table is an exemplary "third table" in the present disclosure. The table and/or function in accordance with the recovery characteristic may be acquired in association with a pulse laser beam irradiation condition so that different tables and/or functions are applied depending on the irradiation condition.

The tables and/or functions may be updated by learning control so that temporal change can be handled.

10.2 Exemplary Control 2

Figure 26:
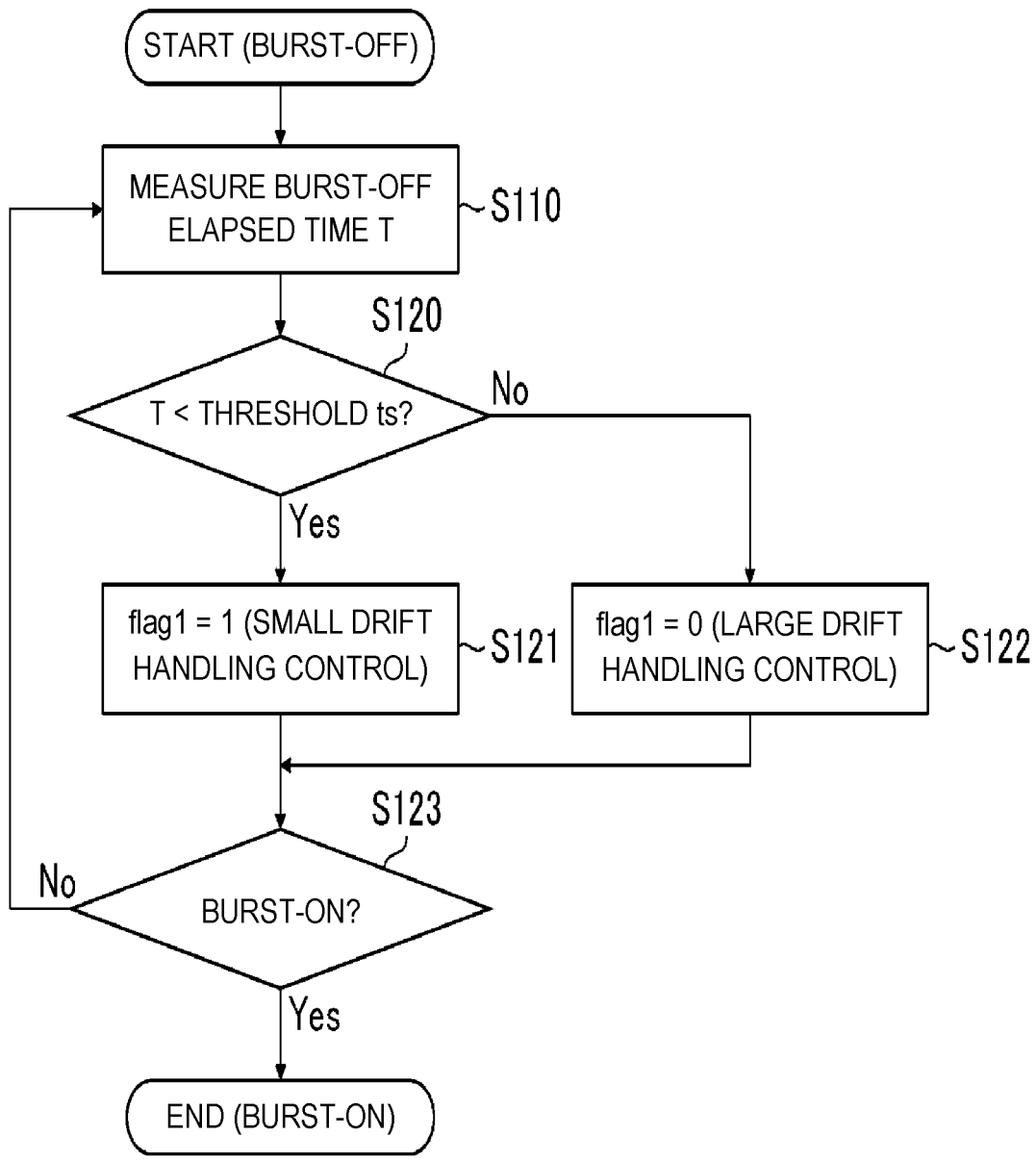
FIG. 26 is a flowchart illustrating other exemplary control in accordance with the length (stop time) of the burst stop duration.

FIG. 26 is a flowchart illustrating other exemplary control in accordance with the length (stop time) of the burst stop duration. Control in accordance with the flowchart in FIG. 26 may be applied in place of control in accordance with the flowchart in FIG. 25. The controller 58 may perform switching between the large drift handling control and the small drift handling control in accordance with elapsed time since the burst-off.

The controller 58 starts the control in accordance with the flowchart in FIG. 26 at the timing of the burst-off. At step S110, the controller 58 measures the elapsed time T since the burst-off.

Then, at step S120, the controller 58 compares the elapsed time T with a threshold ts to determine whether the elapsed time T is smaller than the threshold ts. The threshold ts is an exemplary "third threshold" in the present disclosure.

When the determination at step S120 is positive, in other words, when T<the threshold ts holds, the controller 58 proceeds to step S121 to set the first flag flag1 to "1". Setting the first flag flag1 to "1" means selection of the small drift handling control.

When the determination at step S120 is negative, in other words, when T≥the threshold ts holds, the controller 58 proceeds to step S122 to set the first flag flag1 to "0". Setting the first flag flag1 to "0" means selection of the large drift handling control.

After step S121 or S122, the controller 58 proceeds to step S123. At step S123, the controller 58 determines whether the burst-on is commanded.

When the determination at step S123 is negative, in other words, when the burst-off is maintained, the controller 58 returns to step S110 to continue measurement of the elapsed time T and repeats the processing at steps S110 to S123.

When the determination at step S123 is positive, in other words, at the timing of the burst-on, the controller 58 ends the flowchart in FIG. 26, and transitions to the control during the burst duration described in Embodiment 1 or Embodiment 2. Depending on the value of the first flag flag1 set at step S121 or S122, the large drift handling control or the small drift handling control is performed in accordance with the flowchart in FIG. 10. For example, when the first flag flag1 is set to "1" at step S121 in FIG. 26, the large drift handling control is not performed but the small drift handling control is performed in the burst duration to be subsequently started.

Thereafter, the controller 58 executes the control of the flowchart in FIG. 26 at each burst-off. The burst-off and the burst-on may be determined by using the gate signal with which the external device instructs the burst operation.

10.2.1 Modification

The drive amount −Xs of the BEX stage, in other words, the minifying degree when the large drift handling control is executed during the burst-on in the control of the flowchart in FIG. 26 may be a function of the elapsed time T.

Alternatively, a table that specifies the relation between the drive amount of the BEX stage, in other words, the minifying degree and the elapsed time T in the large drift handling control may be held, and the drive amount may be determined in accordance with the elapsed time T by referring to the table. The function and table are preferably changed in accordance with the energy of the main pulse laser beam MP.

Figure 27:
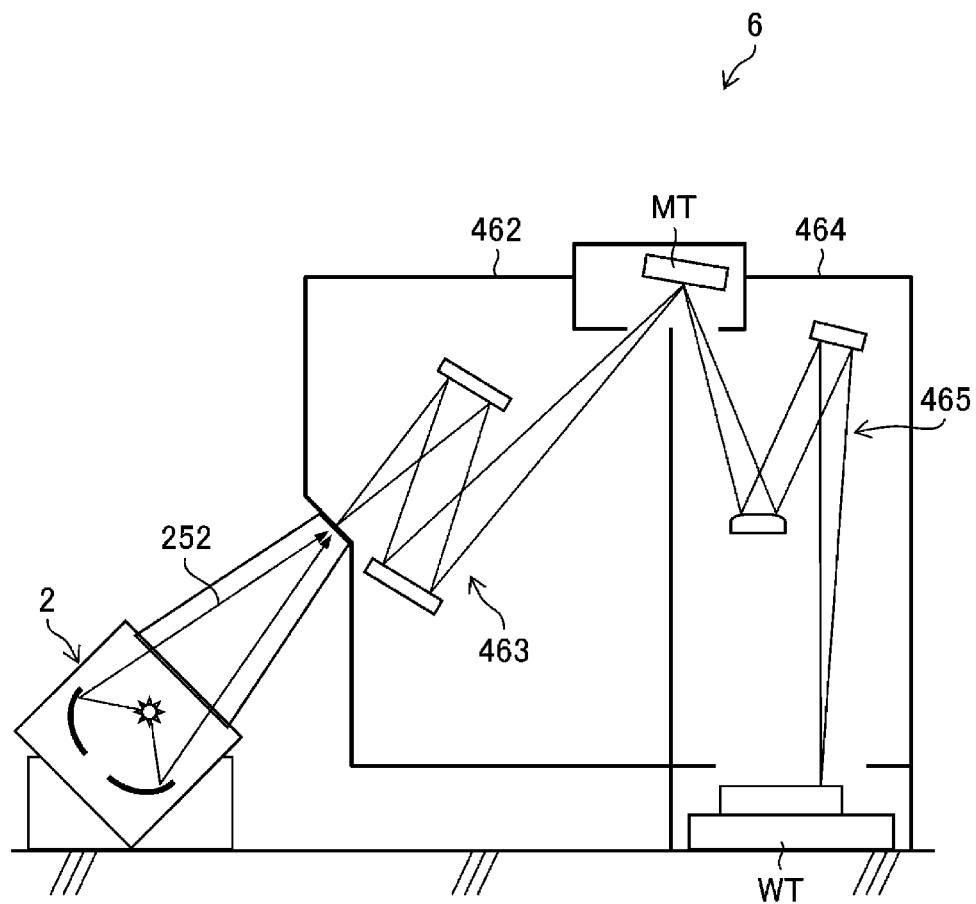
FIG. 27 is a diagram illustrating a schematic configuration of an exposure apparatus connected with the EUV light generation system.

11. Exemplary Electronic Device Manufacturing Method Using EUV Light Generation System FIG. 27 is a diagram illustrating a schematic configuration of the exposure apparatus 6 connected with the EUV light generation apparatus 1. In FIG. 27, the exposure apparatus 6 includes a mask irradiation unit 462 and a workpiece irradiation unit 464. The mask irradiation unit 462 illuminates a mask pattern on a mask table MT with the EUV light 252 incident from the EUV light generation apparatus 1 through a reflection optical system 463.

The workpiece irradiation unit 464 causes the EUV light 252 reflected by the mask table MT to image on a workpiece (not illustrated) disposed on a workpiece table WT through a reflection optical system 465.

The workpiece is a photosensitive substrate such as a semiconductor wafer on which photoresist is applied. The exposure apparatus 6 moves the mask table MT and the workpiece table WT in parallel to each other in synchronization to expose a workpiece to EUV light reflected by a mask pattern.

A semiconductor device can be manufactured by transferring a device pattern onto a semiconductor wafer through the above-described exposure process. The semiconductor device is an exemplary "electronic device" in the present disclosure.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation system comprising:
a pulse laser apparatus configured to output a pulse laser beam, the pulse laser beam being supplied to a predetermined region in a chamber in which plasma containing extreme ultraviolet light is to be generated;
a sensor configured to detect a beam size of the pulse laser beam;
an actuator configured to change the beam size; and
a controller configured to control the actuator based on the beam size detected by the sensor,
the controller being configured to perform, based on a first algorithm, first control that controls the actuator by a first control amount in a direction in which the beam size is minified when the beam size has exceeded a first upper limit threshold determined in advance in one burst duration, and after the first control, perform, based on a second algorithm different from the first algorithm, second control that controls the actuator by a second control amount smaller than the first control amount so that the beam size becomes closer to a target value.

2. The extreme ultraviolet light generation system according to claim 1, further comprising a beam transmission device including a first optical element configured to transmit the pulse laser beam output from the pulse laser apparatus, wherein the sensor receives part of the pulse laser beam transmitted through the first optical element.

3. The extreme ultraviolet light generation system according to claim 2, wherein
a beam expander is disposed on an optical path of the pulse laser beam between the pulse laser apparatus and the first optical element, and
the beam size is changed through movement of a second optical element included in the beam expander by the actuator.

4. The extreme ultraviolet light generation system according to claim 1, wherein magnitudes of the first control amount and the second control amount are fixed values determined in advance.

5. The extreme ultraviolet light generation system according to claim 1, wherein the controller performs the second control when the beam size has become smaller than a first lower limit threshold determined in advance after the first control.

6. The extreme ultraviolet light generation system according to claim 1, wherein
the first algorithm is a threshold control algorithm using the first upper limit threshold, and
the second algorithm is an algorithm in which a second lower limit threshold and a second upper limit threshold indicating an allowable range of the target value are defined, and that controls the actuator by the second control amount in a direction in which the beam size is magnified when the beam size has become smaller than the second lower limit threshold, and controls the actuator by the second control amount in a direction in which the beam size is minified when the beam size has exceeded the second upper limit threshold.

7. The extreme ultraviolet light generation system according to claim 1, wherein
the first algorithm is a threshold control algorithm using the first upper limit threshold, and
the second algorithm is a feedback control algorithm that controls the actuator so that the beam size becomes equal to a value within a predetermined allowable range including the target value.

8. The extreme ultraviolet light generation system according to claim 1, wherein the controller
calculates a first beam magnifying speed indicating a change amount of the beam size per time unit when the first control is not performed from values of the beam size detected by the sensor at a predetermined time interval in the burst duration, and
switches the first control to the second control when the first beam magnifying speed has become smaller than a first threshold determined in advance.

9. The extreme ultraviolet light generation system according to claim 1, wherein the controller
measures a first elapsed time from start of the burst duration, and
switches the first control to the second control when the first elapsed time has exceeded a second threshold determined in advance.

10. The extreme ultraviolet light generation system according to claim 9, wherein the second threshold is set to a value in a range of 50 ms to 200 ms inclusive.

11. The extreme ultraviolet light generation system according to claim 1, wherein the controller
calculates a second beam magnifying speed indicating a change amount of the beam size per time unit from values of the beam size detected by the sensor at a predetermined time interval in a duration before start of drive of the actuator by the first control in the burst duration, and
determines the first control amount in accordance with the second beam magnifying speed by using a first function or a first table indicating a relation between the second beam magnifying speed and the first control amount.

12. The extreme ultraviolet light generation system according to claim 1, wherein
the second algorithm is a PID control algorithm using proportional control, integral control, and differential control, and
the controller sets the target value and controls the beam size to the target value by the PID control.

13. The extreme ultraviolet light generation system according to claim 1, wherein the controller
calculates a third beam magnifying speed indicating a change amount of the beam size per time unit from values of the beam size detected by the sensor at a predetermined time interval after drive of the actuator by the first control in the burst duration, and
determines the second control amount in accordance with the third beam magnifying speed by using a second function or a second table indicating a relation between the third beam magnifying speed and the second control amount.

14. The extreme ultraviolet light generation system according to claim 1, wherein the controller determines a minifying degree of the beam size by the actuator in a burst stop duration based on a recovery characteristic of the beam size in the burst stop duration, and controls the actuator based on the determined minifying degree.

15. The extreme ultraviolet light generation system according to claim 14, wherein
the recovery characteristic indicates a correspondence relation between a second elapsed time from start of the burst stop duration and the beam size, and
the controller controls the actuator by applying the minifying degree in accordance with the second elapsed time by using a third function or a third table indicating a relation between the second elapsed time in accordance with the recovery characteristic and the minifying degree.

16. The extreme ultraviolet light generation system according to claim 1, wherein the controller
measures a second elapsed time from start of a burst stop duration,
performs the second control without performing the first control in a next burst duration when the second elapsed time is shorter than a third threshold determined in advance, and
performs the first control and the second control in the next burst duration when the second elapsed time is equal to or longer than the third threshold.

17. The extreme ultraviolet light generation system according to claim 1, wherein the controller
receives a gate signal including a burst operation instruction from an external device, and
controls the actuator based on the received gate signal.

18. The extreme ultraviolet light generation system according to claim 1, wherein
the pulse laser apparatus includes a $CO_2$ laser apparatus, and
the pulse laser beam includes a $CO_2$ laser beam.

19. A laser beam size controlling method comprising:
outputting a pulse laser beam from a pulse laser apparatus;
transmitting the pulse laser beam to a predetermined region in a chamber in which plasma containing extreme ultraviolet light is to be generated;
detecting a beam size of the pulse laser beam by using a sensor; and
controlling, by a controller, an actuator based on the beam size detected by using the sensor,
the controller being configured to perform, based on a first algorithm, first control that controls the actuator by a first control amount in a direction in which the beam size is minified when the beam size has exceeded a first upper limit threshold determined in advance in one burst duration, and after the first control, perform, based on a second algorithm different from the first algorithm, second control that controls the actuator by a second control amount smaller than the first control amount so that the beam size becomes closer to a target value.

20. An electronic device manufacturing method comprising:
irradiating a target substance with a pulse laser beam to generate plasma from the target substance and generate the extreme ultraviolet light, by using an extreme ultraviolet light generation system including
a pulse laser apparatus configured to output the pulse laser beam, the pulse laser beam being supplied to a predetermined region in a chamber in which plasma containing extreme ultraviolet light is to be generated,
a sensor configured to detect a beam size of the pulse laser beam,
an actuator configured to change the beam size, and
a controller configured to control the actuator based on the beam size detected by the sensor,
the controller being configured to perform, based on a first algorithm, first control that controls the actuator by a first control amount in a direction in which the beam size is minified when the beam size has exceeded a first upper limit threshold determined in advance in one burst duration, and after the first control, perform, based on a second algorithm different from the first algorithm, second control that controls the actuator by a second control amount smaller than the first control amount so that the beam size becomes closer to a target value;

outputting the extreme ultraviolet light to an exposure apparatus; and exposing a photosensitive substrate to the extreme ultraviolet light in the exposure apparatus to manufacture an electronic device.

* * * * *